US012666813B2

(12) United States Patent
Li et al.

(10) Patent No.: US 12,666,813 B2
(45) Date of Patent: **\*Jun. 23, 2026**

(54) DISPLAY SUBSTRATE AND DISPLAY DEVICE HAVING SCANNING LINE

(71) Applicants: HEFEI BOE JOINT TECHNOLOGY CO., LTD., Hefei (CN); BOE TECHNOLOGY GROUP CO., LTD., Beijing (CN)

(72) Inventors: Yongqian Li, Beijing (CN); Can Yuan, Beijing (CN); Xuehuan Feng, Beijing (CN)

(73) Assignees: HEFEI BOE JOINT TECHNOLOGY CO., LTD., Hefei (CN); BOE TECHNOLOGY GROUP CO., LTD., Beijing (CN)

( \* ) Notice: Subject to any disclaimer, the term of this patent is extended or adjusted under 35 U.S.C. 154(b) by 0 days.

This patent is subject to a terminal disclaimer.

(21) Appl. No.: 19/013,609

(22) Filed: Jan. 8, 2025

(65) Prior Publication Data

US 2025/0151540 A1 May 8, 2025

Related U.S. Application Data

(63) Continuation of application No. 17/795,447, filed as application No. PCT/CN2021/114556 on Aug. 25, 2021, now Pat. No. 12,219,827.

(51) Int. Cl.
*H10K 59/126* (2023.01)
*G09G 3/3225* (2016.01)
*H10K 59/131* (2023.01)

(52) U.S. Cl.
CPC ......... *H10K 59/126* (2023.02); *G09G 3/3225* (2013.01); *H10K 59/131* (2023.02);
(Continued)

(58) Field of Classification Search
CPC .. H10K 59/126; H10K 59/131; G09G 3/3225; G09G 2300/0842; G09G 2320/0223
See application file for complete search history.

(56) References Cited

U.S. PATENT DOCUMENTS 12,219,827 B2 \* 2/2025 Li ........................ G09G 3/3225
2016/0322387 A1 11/2016 Kim et al.

FOREIGN PATENT DOCUMENTS

JP      2007027589 A      2/2007
JP      2017120784 A      7/2017
(Continued)

OTHER PUBLICATIONS

First Japanese Office Action for Japanese Application No. 2023-560185 mailed Mar. 19, 2025. 8 pages.

*Primary Examiner* — Stephen G Sherman
(74) *Attorney, Agent, or Firm* — BROOKS KUSHMAN P.C.

(57) ABSTRACT

A display substrate and a display device. The display substrate includes a base substrate, and a plurality of pixel units and a plurality of scanning lines on the base substrate. Each pixel unit includes a plurality of sub-pixels and a light shielding layer, the plurality of sub-pixels is arranged in sequence in a first direction, each sub-pixel includes a sub-pixel driving circuitry and a light-emitting element coupled to each other, and the sub-pixel driving circuitry is configured to provide a driving signal to the light-emitting element. At least a part of the light shielding layer is arranged between the sub-pixel driving circuitry and the base substrate. Each scanning line includes at least a part extending in the first direction, is coupled to a corresponding sub-pixel driving circuitry, and is arranged at a same layer as the light shielding layer.

17 Claims, 16 Drawing Sheets

(52) U.S. Cl.
CPC ............... *G09G 2300/0842* (2013.01); *G09G*
*2320/0223* (2013.01)

(56)                         References Cited

FOREIGN PATENT DOCUMENTS

| | | |
|----|------------------|--------|
| KR | 20160039092 A | 4/2016 |
| KR | 20160055648 A | 5/2016 |
| WO | 2008004348 A1 | 1/2008 |
| WO | 2017159413 A1 | 9/2017 |

* cited by examiner

DISPLAY SUBSTRATE AND DISPLAY DEVICE HAVING SCANNING LINE

CROSS-REFERENCE TO RELATED APPLICATIONS

This application is a continuation of U.S. Non-Provisional patent application Ser. No. 17/795,447 filed on Jul. 26, 2022, which is the U.S. National Phase Application of PCT Application No. PCT/CN2021/114556 filed on Aug. 25, 2021, which are incorporated herein by reference in their entireties.

TECHNICAL FIELD

The present disclosure relates to the field of display technology, in particular to a display substrate and a display device.

BACKGROUND

In the field of display technology, liquid crystal display technology and active matrix Organic Light-Emitting Diode (OLED) display technology are mature. For an OLED display product, a spectrum at various wavelengths is excited through direct combination of electrons and holes, so as to form patterns. An OLED display device is expected to become a next-generation mainstream display product due to such advantages as rapid response and maximum contrast.

When an OLED display element is used for large-size, high resolution display, there is a limited space for the arrangement of pixels. In addition, a resistance capacitance (RC) delay of a signal line is too large due to a line width and a line spacing. Hence, the performance of the display device may be adversely affected.

SUMMARY

An object of the present disclosure is to provide a display substrate and a display device, so as to solve the above-mentioned problems.

In order to achieve the above-mentioned object, the present disclosure provides the following technical solutions.

In one aspect, the present disclosure provides in some embodiments a display substrate, including a base substrate and a plurality of pixel units on the base substrate. Each pixel unit includes: a plurality of sub-pixels arranged in sequence in a first direction, each sub-pixel including a sub-pixel driving circuitry and a light-emitting element coupled to each other, and the sub-pixel driving circuitry being configured to provide a driving signal to the light-emitting element; and a light shielding layer, at least a part of the light shielding layer being arranged between the sub-pixel driving circuitry and the base substrate. The display substrate further includes a plurality of scanning lines, each scanning line includes at least a part extending in the first direction and is coupled to a corresponding sub-pixel driving circuitry, and the scanning line and is arranged at a same layer as the light shielding layer.

In a possible embodiment of the present disclosure, a thickness d of the scanning line in a direction perpendicular to the base substrate is greater than or equal to 0.5 μm and less than or equal to 1.5 μm.

In a possible embodiment of the present disclosure, the scanning line is arranged at a same layer and made of a same material as the light shielding layer.

In a possible embodiment of the present disclosure, the display substrate further includes an auxiliary scanning line arranged at a side of a corresponding scanning line away from the base substrate and coupled to the corresponding scanning line and a sub-pixel driving circuitry in a corresponding sub-pixel.

In a possible embodiment of the present disclosure, the auxiliary scanning line includes a first auxiliary scanning pattern, a second auxiliary scanning pattern and a third auxiliary scanning pattern, the third auxiliary scanning pattern is arranged between the first auxiliary scanning pattern and the second auxiliary scanning pattern, the first auxiliary scanning pattern and the second auxiliary scanning pattern are coupled to the sub-pixel driving circuitry in the corresponding sub-pixel, and the third auxiliary scanning pattern is coupled to the corresponding scanning line, the first auxiliary scanning pattern and the second auxiliary scanning pattern. The scanning line coupled to the third auxiliary scanning pattern includes a first boundary and a second boundary arranged in a second direction, the second direction crosses the first direction, an orthogonal projection of the first boundary onto the base substrate partially overlaps an orthogonal projection of the first auxiliary scanning pattern onto the base substrate, and an orthogonal projection of the second boundary onto the base substrate partially overlaps an orthogonal projection of the second auxiliary scanning pattern onto the base substrate.

In a possible embodiment of the present disclosure, the display substrate further includes: a data line including at least a part extending in a second direction n crossing the first direction, the data line being coupled to the corresponding sub-pixel driving circuitry; and an auxiliary data line coupled to a corresponding data line, arranged between the corresponding data line and the base substrate, and arranged at a same layer and made of a same material as the light shielding layer.

In a possible embodiment of the present disclosure, the scanning line includes a first scanning portion and a second scanning portion, the first scanning portion and the second scanning portion extend in the first direction, a width of the first scanning portion is less than a width of the second scanning portion in a direction perpendicular to the first direction, and an orthogonal projection of the first scanning portion onto the base substrate at least partially overlaps an orthogonal projection of the data line onto the base substrate.

In a possible embodiment of the present disclosure, the auxiliary data line includes at least two auxiliary data patterns arranged in the second direction, and coupled to a corresponding data line.

In a possible embodiment of the present disclosure, an orthogonal projection of the scanning line onto the base substrate is arranged between orthogonal projections of adjacent auxiliary data patterns onto the base substrate.

In a possible embodiment of the present disclosure, the display substrate further includes: a power source line including at least a part extending in the second direction and coupled to the corresponding sub-pixel driving circuitry; and an auxiliary power source line coupled to a corresponding power source line, arranged between the power source line and the base substrate, and arranged at a same layer and made of a same material as the light shielding layer.

In a possible embodiment of the present disclosure, the auxiliary power source line includes at least two auxiliary power source patterns arranged in the second direction and coupled to the corresponding power source line.

In a possible embodiment of the present disclosure, an orthogonal projection of at least one of the scanning lines onto the base substrate is arranged between orthogonal projections of adjacent auxiliary power source patterns onto the base substrate.

In a possible embodiment of the present disclosure, the display substrate includes: a sensing line including at least a part extending in the second direction; and an auxiliary sensing line coupled to the sensing line, arranged between the sensing line and the base substrate, and arranged at a same layer and made of a same material as the light shielding layer. The auxiliary sensing line includes at least a part extending in the first direction, and is coupled to the corresponding sub-pixel driving circuitry.

In a possible embodiment of the present disclosure, the sub-pixel driving circuitry includes: a driving transistor, a first electrode of the driving transistor being coupled to the power source line, and a second electrode of the driving transistor being coupled to the light-emitting element; a writing transistor, a gate electrode of the writing transistor being coupled to the scanning line, a first electrode of the writing transistor being coupled to the data line, and a second electrode of the writing transistor being coupled to a gate electrode of the driving transistor; a sensing transistor, a gate electrode of the sensing transistor being coupled to the scanning line, a first electrode of the sensing transistor being coupled to the second electrode of the driving transistor, and a second electrode of the sensing transistor being coupled to the sensing line; and a storage capacitor, a first electrode plate of the storage capacitor being coupled to the gate electrode of the driving transistor, and a second electrode plate of the storage capacitor being coupled to the second electrode of the driving transistor.

In a possible embodiment of the present disclosure, the writing transistor includes a writing active layer, the sensing transistor includes a sensing active layer, and in a same pixel unit, an orthogonal projection of the writing active layer onto the base substrate is arranged at a first side of an orthogonal projection of the scanning line coupled to the writing transistor onto the base substrate, an orthogonal projection of the sensing active layer onto the base substrate is arranged at a second side of the orthogonal projection of the scanning line onto the base substrate, and the first side and the second side are opposite to each other in the second direction.

In a possible embodiment of the present disclosure, the driving transistor includes a driving active layer, and at least a part of the orthogonal projection of the writing active layer onto the base substrate is arranged between an orthogonal projection of the driving active layer onto the base substrate and the orthogonal projection of the scanning line onto the base substrate.

In a possible embodiment of the present disclosure, the sub-pixel further includes a pixel definition layer for defining a pixel aperture, and in a same sub-pixel, the orthogonal projection of the sensing active layer onto the base substrate is arranged between an orthogonal projection of the pixel aperture onto the base substrate and the orthogonal projection of the scanning line onto the base substrate.

In a possible embodiment of the present disclosure, the first electrode plate is arranged at a same layer and made of a same material as the driving active layer, the second electrode plate is arranged at a same layer and made of a same material as the data line, the second electrode plate is coupled to the light shielding layer, and an orthogonal projection of the second electrode plate onto the base substrate at least partially overlaps an orthogonal projection of the light shielding layer onto the base substrate.

In a possible embodiment of the present disclosure, the driving active layer includes a driving channel portion, and the orthogonal projection of the light shielding layer onto the base substrate at least partially overlaps an orthogonal projection of the driving channel portion onto the base substrate.

In another aspect, the present disclosure provides in some embodiments a display device including the above-mentioned display substrate.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure. In these drawings.

DETAILED DESCRIPTION

In order to further illustrate the display substrate and the display device in the embodiments of the present disclosure, the present disclosure will be described hereinafter in a clear and complete manner in conjunction with the drawings and embodiments.

Figure 1:
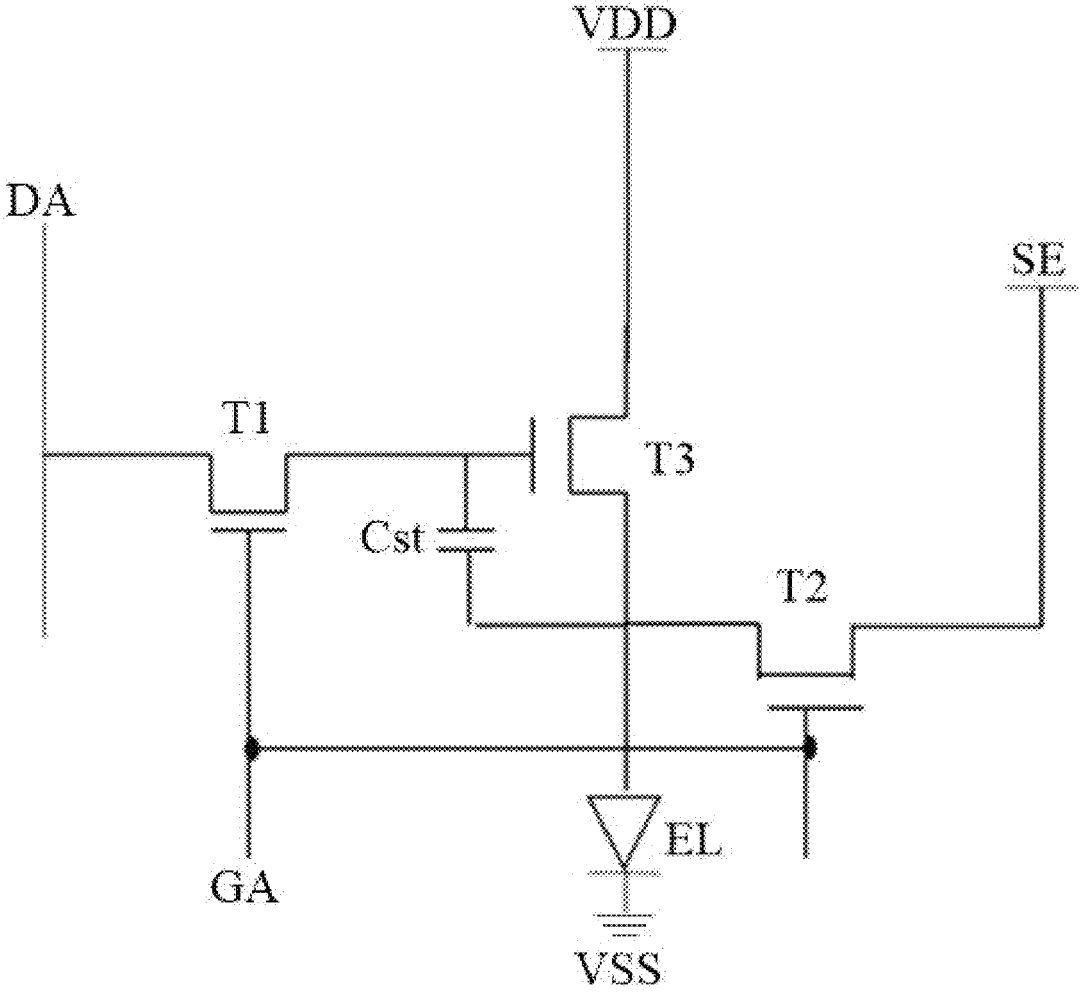
FIG. 1 is a circuit diagram of a sub-pixel driving circuitry according to one embodiment of the present disclosure.
Figure 2:
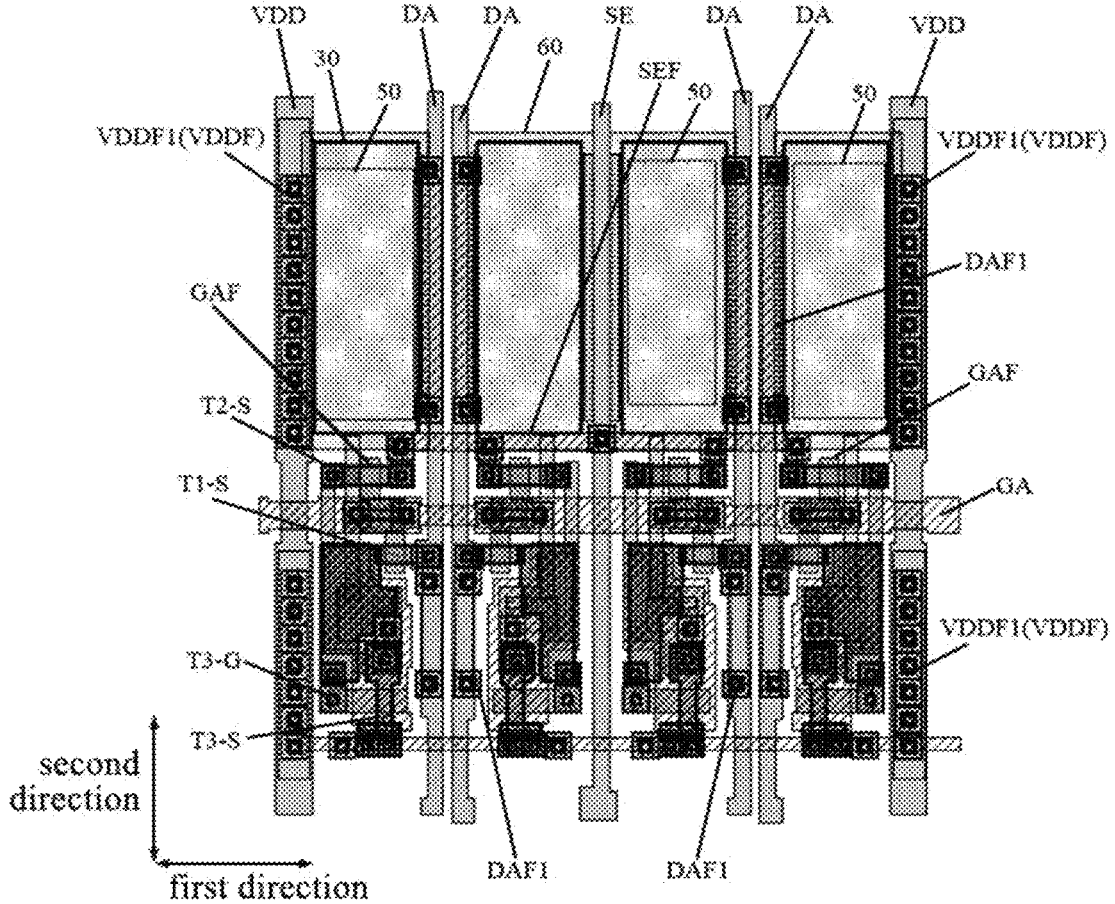
FIG. 2 is schematic view showing a pixel unit according to one embodiment of the present disclosure.
Figure 3:
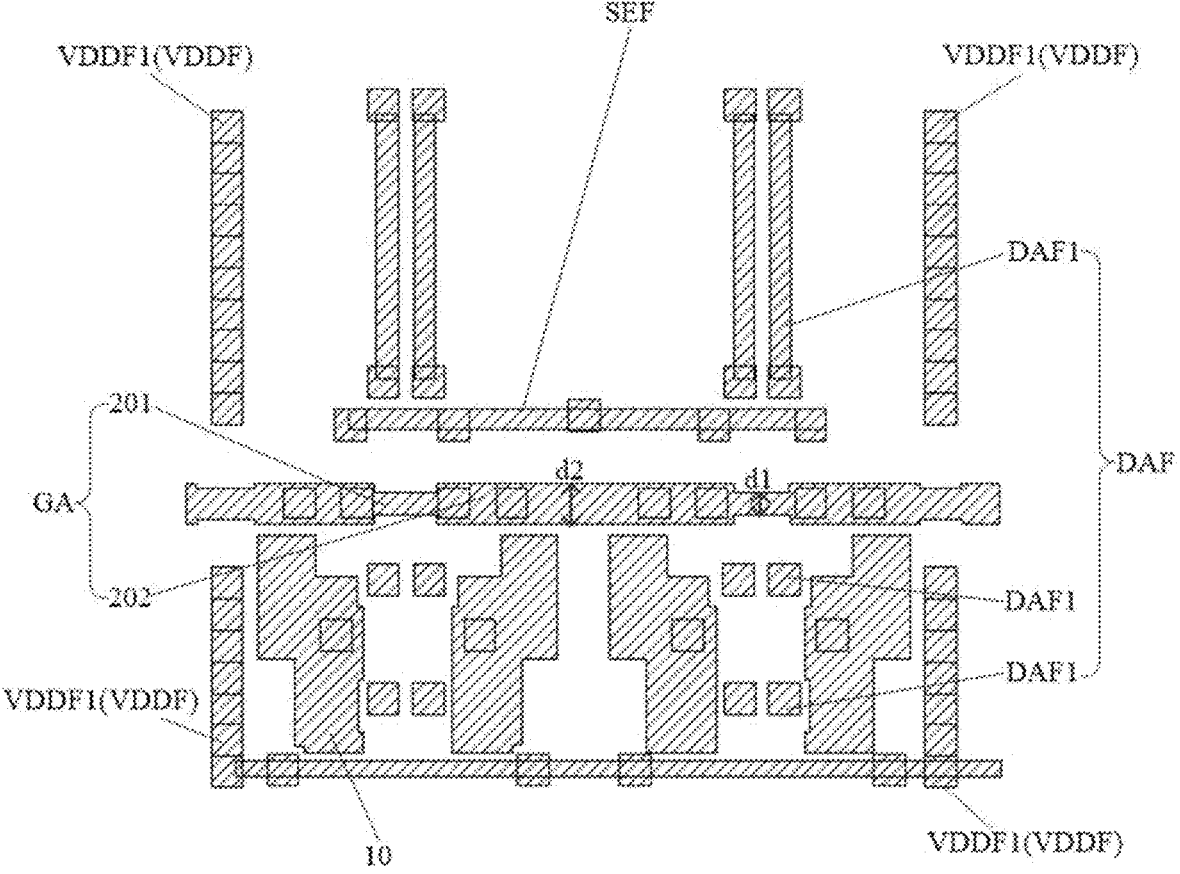
FIG. 3 is a schematic view showing a light shielding layer in FIG. 2.

As shown in FIG. 1, FIG. 2 and FIG. 3, the present disclosure provides in some embodiments a display substrate, including a base substrate and a plurality of pixel units on the base substrate. Each pixel unit includes: a plurality of sub-pixels arranged in sequence in a first direction, each sub-pixel including a sub-pixel driving circuitry and a light-emitting element EL coupled to each other, and the sub-pixel driving circuitry being configured to provide a driving signal to the light-emitting element EL; and a light shielding layer 10, at least a part of the light shielding layer 10 being arranged between the sub-pixel driving circuitry and the base substrate. The display substrate further includes a plurality of scanning lines GA, each scanning line GA includes at least a part extending in the first direction and is coupled to a corresponding sub-pixel driving circuitry, and the scanning line GA and is arranged at a same layer as the light shielding layer 10.

For example, the plurality of pixel units is distributed on the base substrate in an array form, i.e., the plurality of pixel units is arranged in rows and columns. The pixel units in rows are arranged in a second direction, and the pixel units in each row includes a plurality of pixel units arranged in the first direction. The pixel units in columns are arranged in the first direction, and the pixel units in each column include a plurality of pixel units arranged in the second direction.

For example, the first direction includes a horizontal direction, and the second direction includes a vertical direction.

For example, the pixel unit includes a red sub-pixel, a green sub-pixel, a blue sub-pixel and a white sub-pixel.

For example, each sub-pixel includes the sub-pixel driving circuitry and the light-emitting element EL, and the sub-pixel driving circuitry is coupled to an anode of the light-emitting element EL to provide a driving signal to the anode. For example, the sub-pixel driving circuitry includes, but not limited to, a 3T1C (i.e., three transistors and one capacitor) structure. A cathode of the light-emitting element EL receives a negative power source signal VSS.

As shown in FIG. 2 to FIG. 11, FIG. 17 and FIG. 18, for example, the display substrate includes the light shielding layer 10, an active layer, a gate insulation layer, a gate metal layer, an interlayer insulation layer, a source/drain metal layer, a passivation layer, a color film layer 50, a planarization layer, an anode layer 60, a pixel definition layer, a light-emitting functional layer and a cathode layer laminated one on another in a direction away from the base substrate. The pixel definition layer defines a pixel aperture, and a region where the pixel aperture is located forms a pixel aperture region 30.

Figure 6:
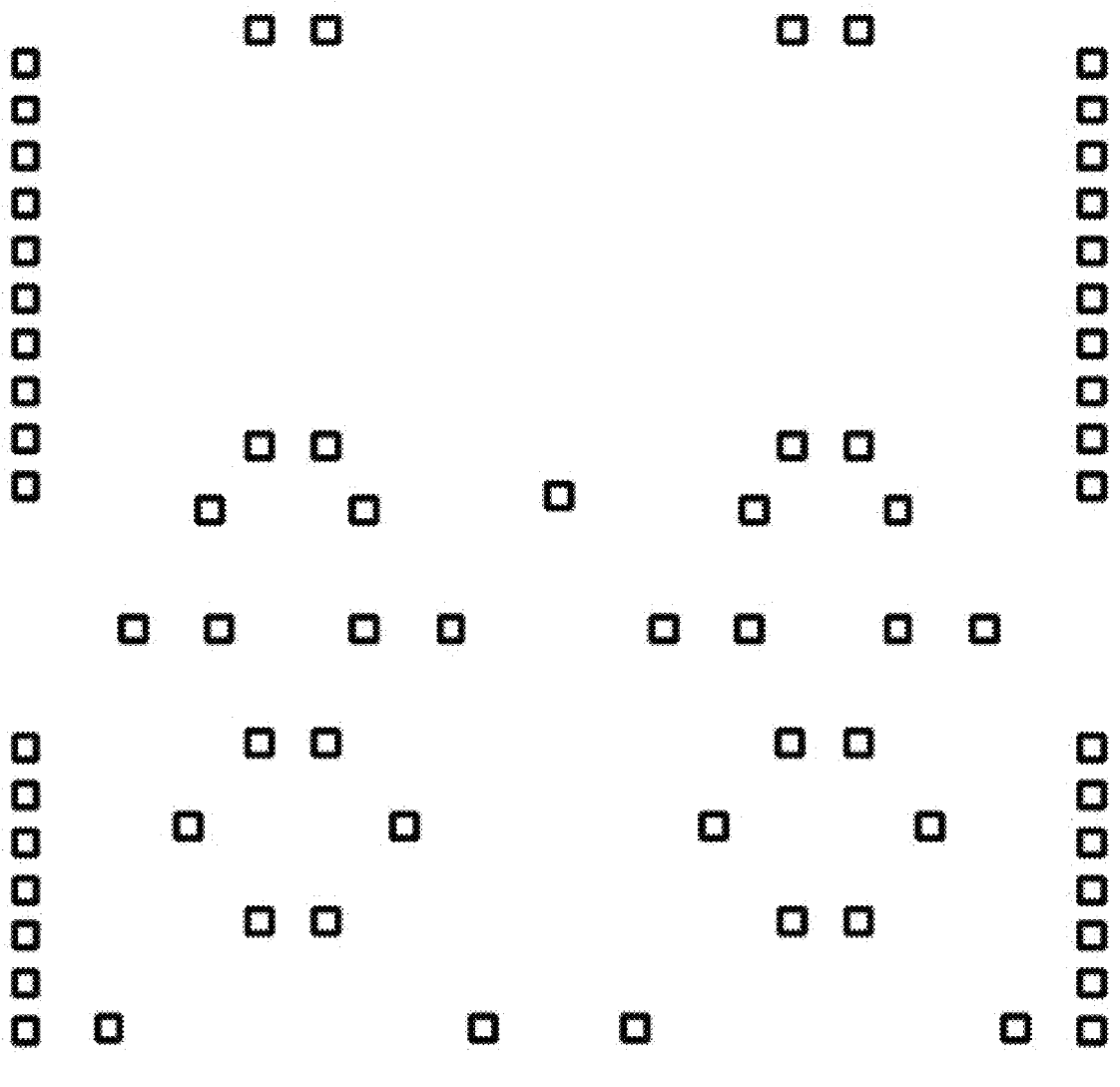
FIG. 6 is a schematic view showing via holes formed through a CNT process according to one embodiment of the present disclosure.
Figure 7:
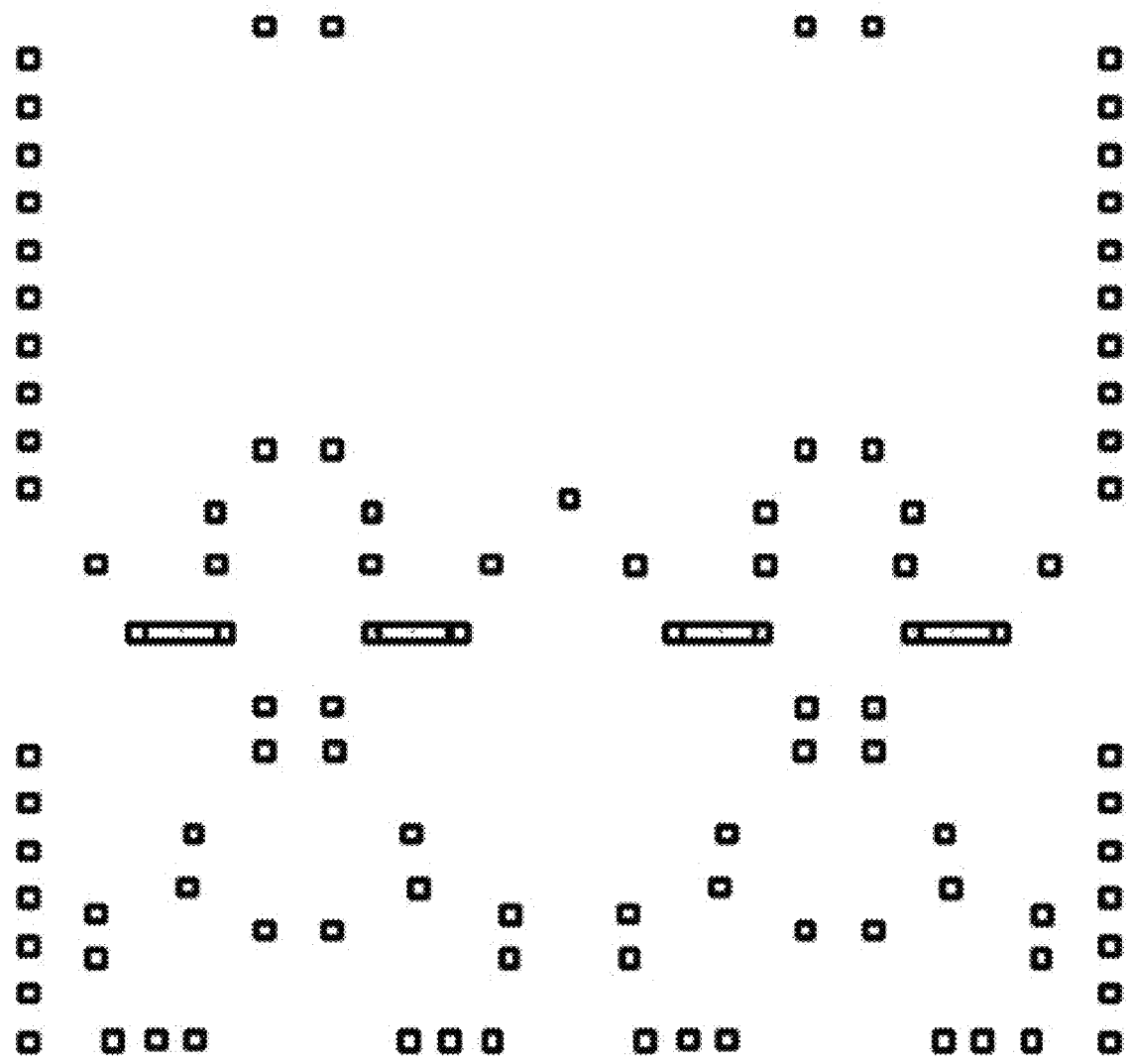
FIG. 7 is a schematic view showing via holes formed through patterning an interlayer insulation layer according to one embodiment of the present disclosure.
Figure 14:
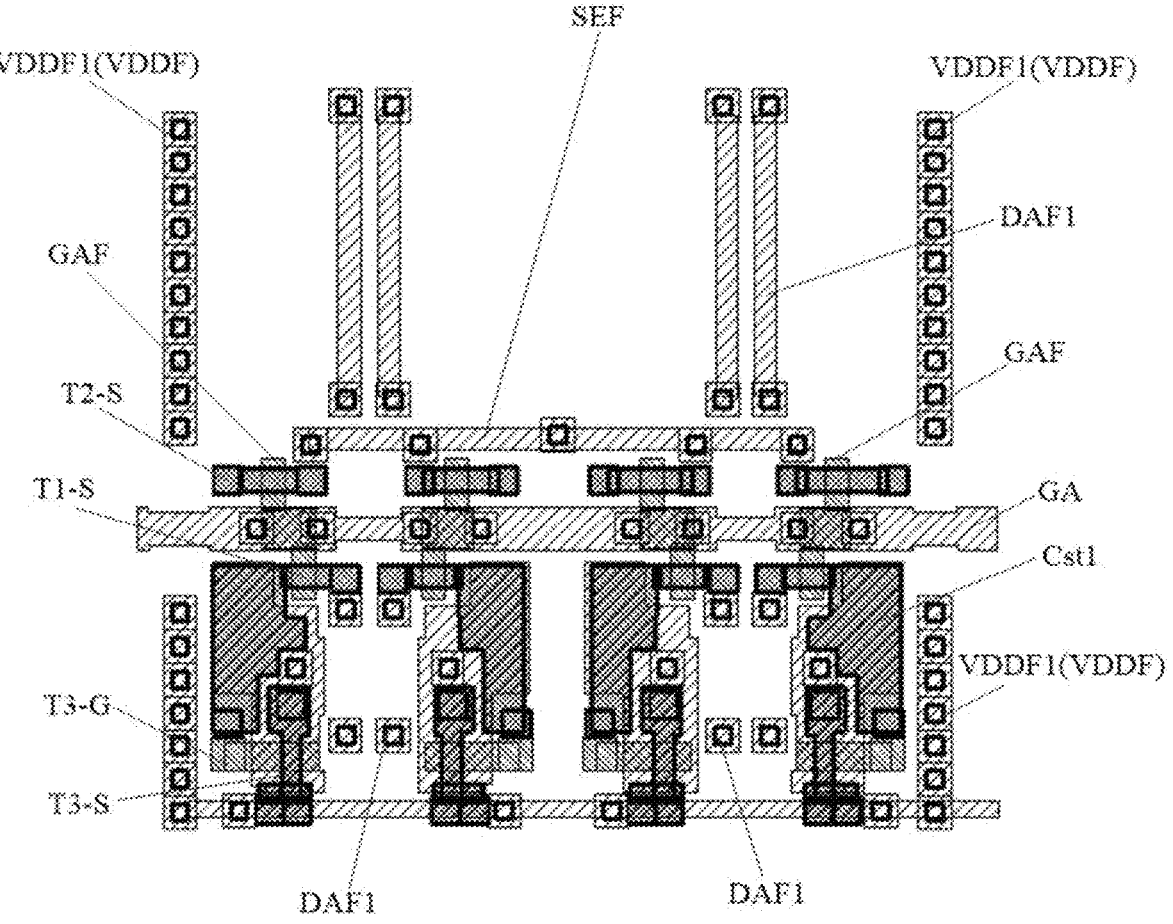
FIG. 14 is a schematic view showing the addition of via holes formed through the CNT process in FIG. 13.
Figure 15:
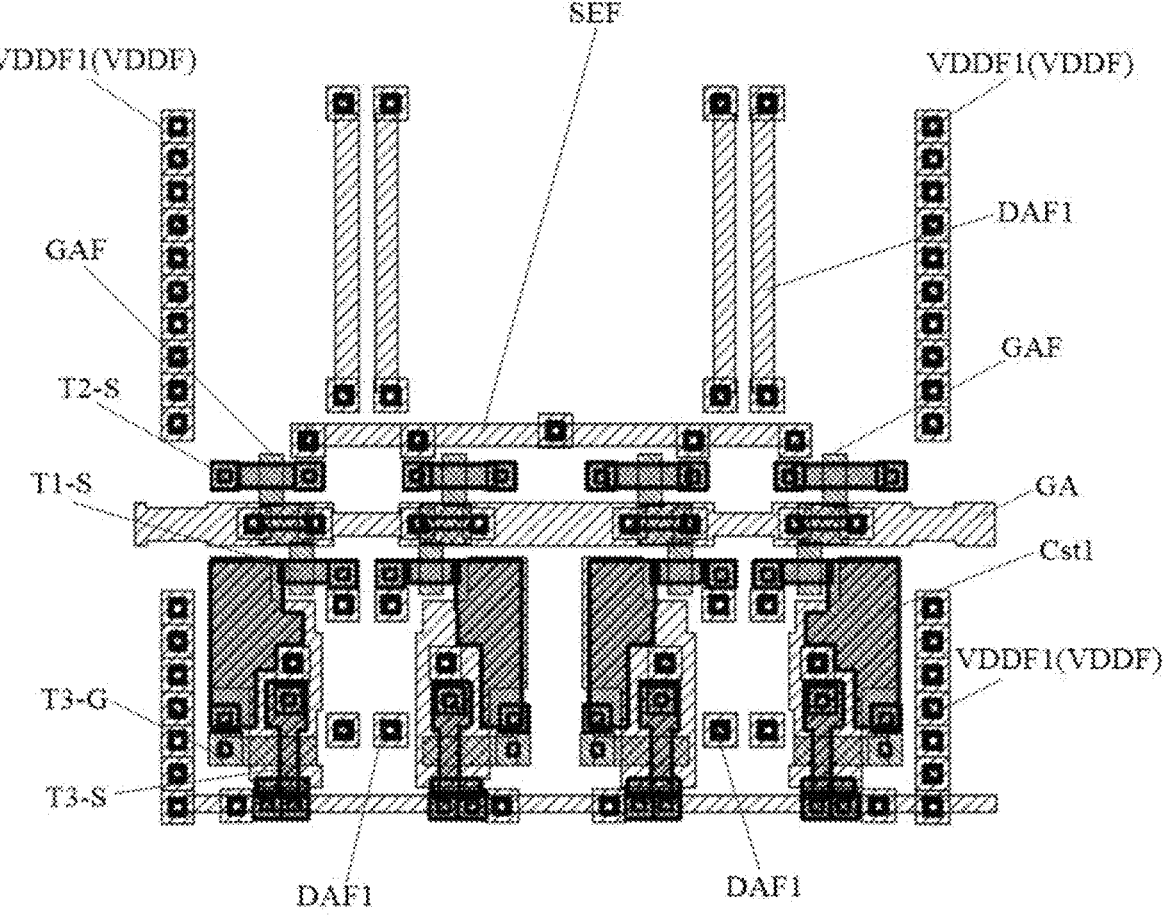
FIG. 15 is a schematic view showing the addition of via holes in the interlayer insulation layer in FIG. 14.
Figure 16:
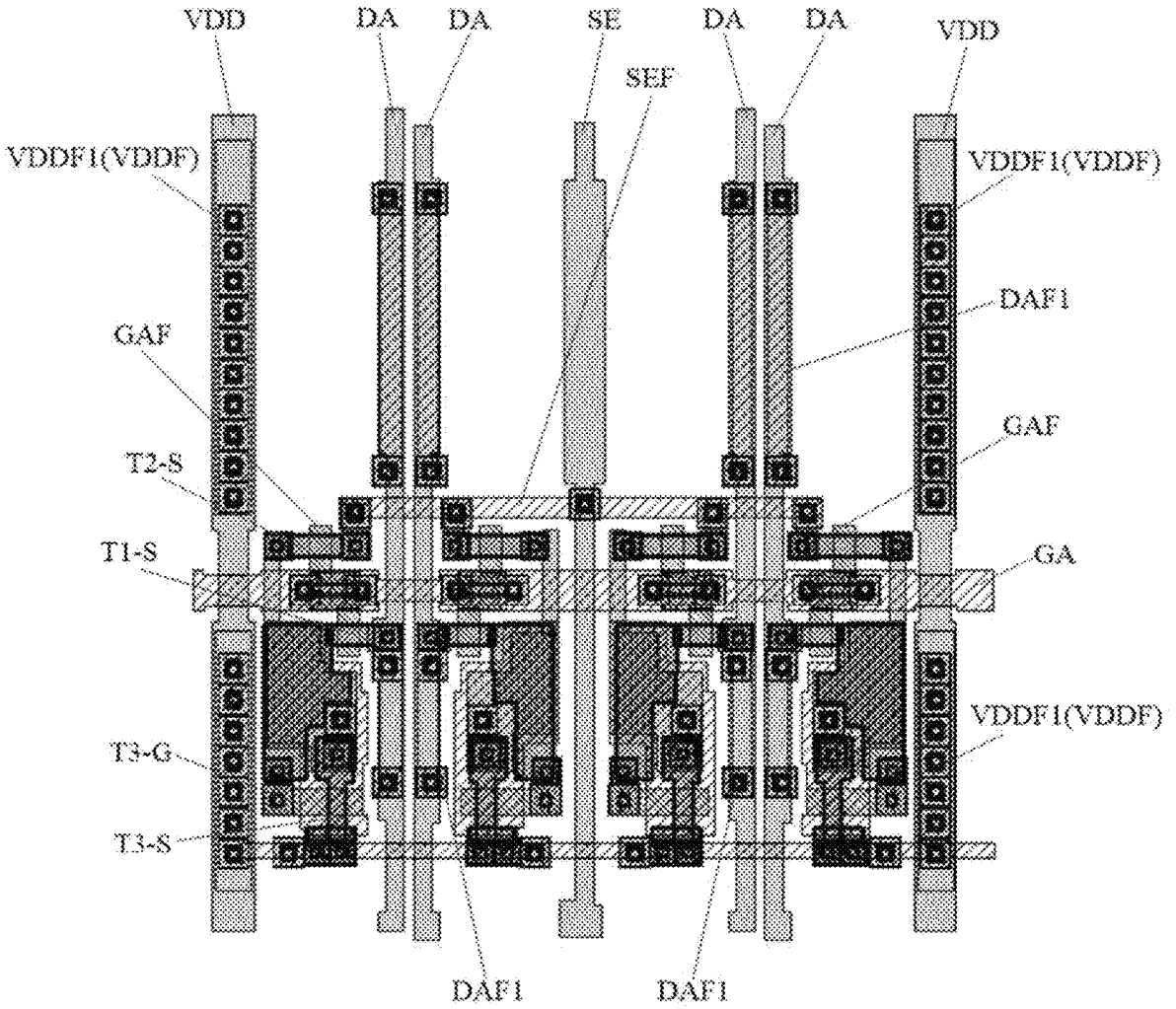
FIG. 16 is a schematic view showing the addition of the source/drain metal layer in FIG. 15.
Figure 17:
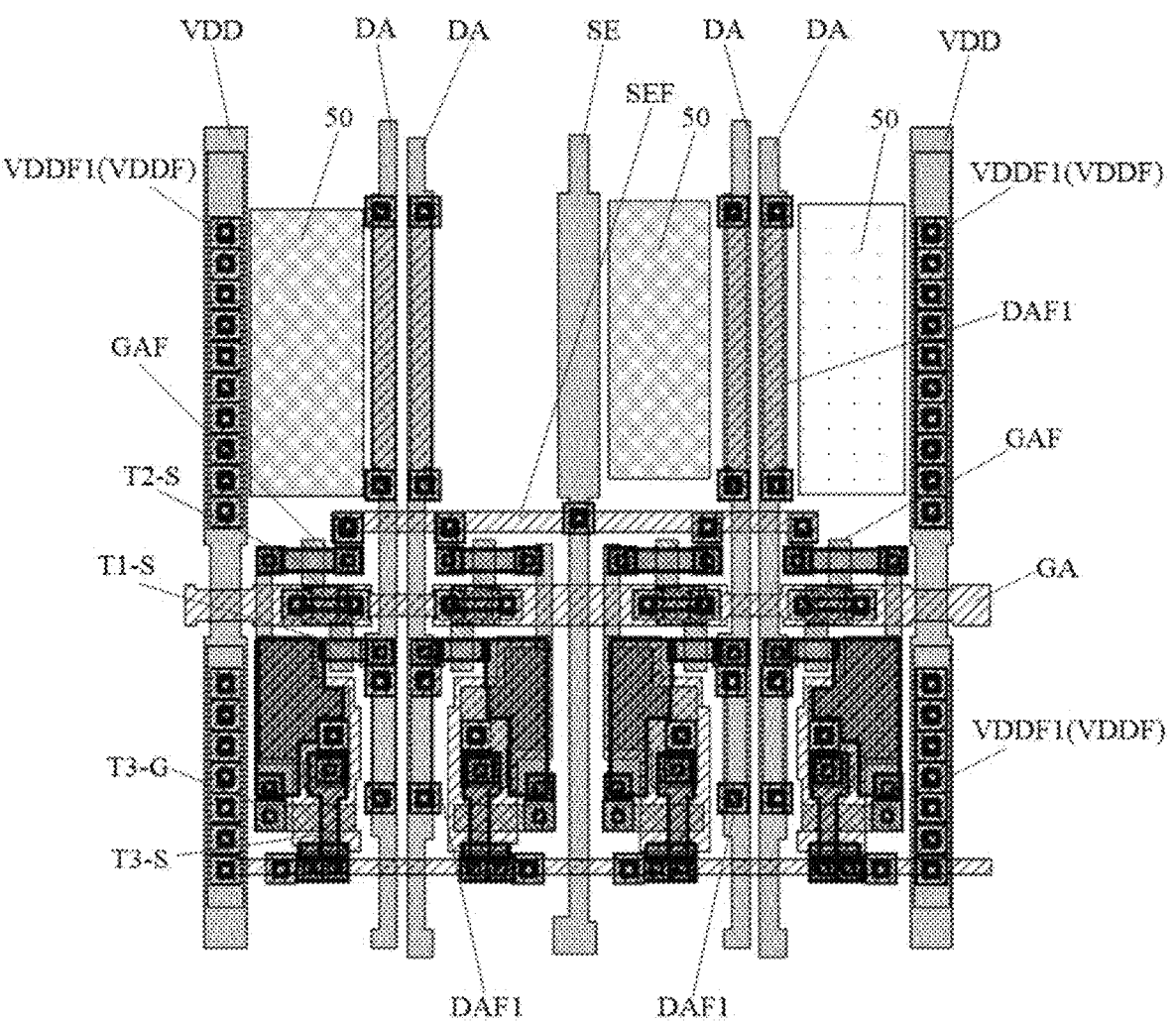
FIG. 17 is a schematic view showing the addition of color filter pattern in FIG. 16.
Figure 18:
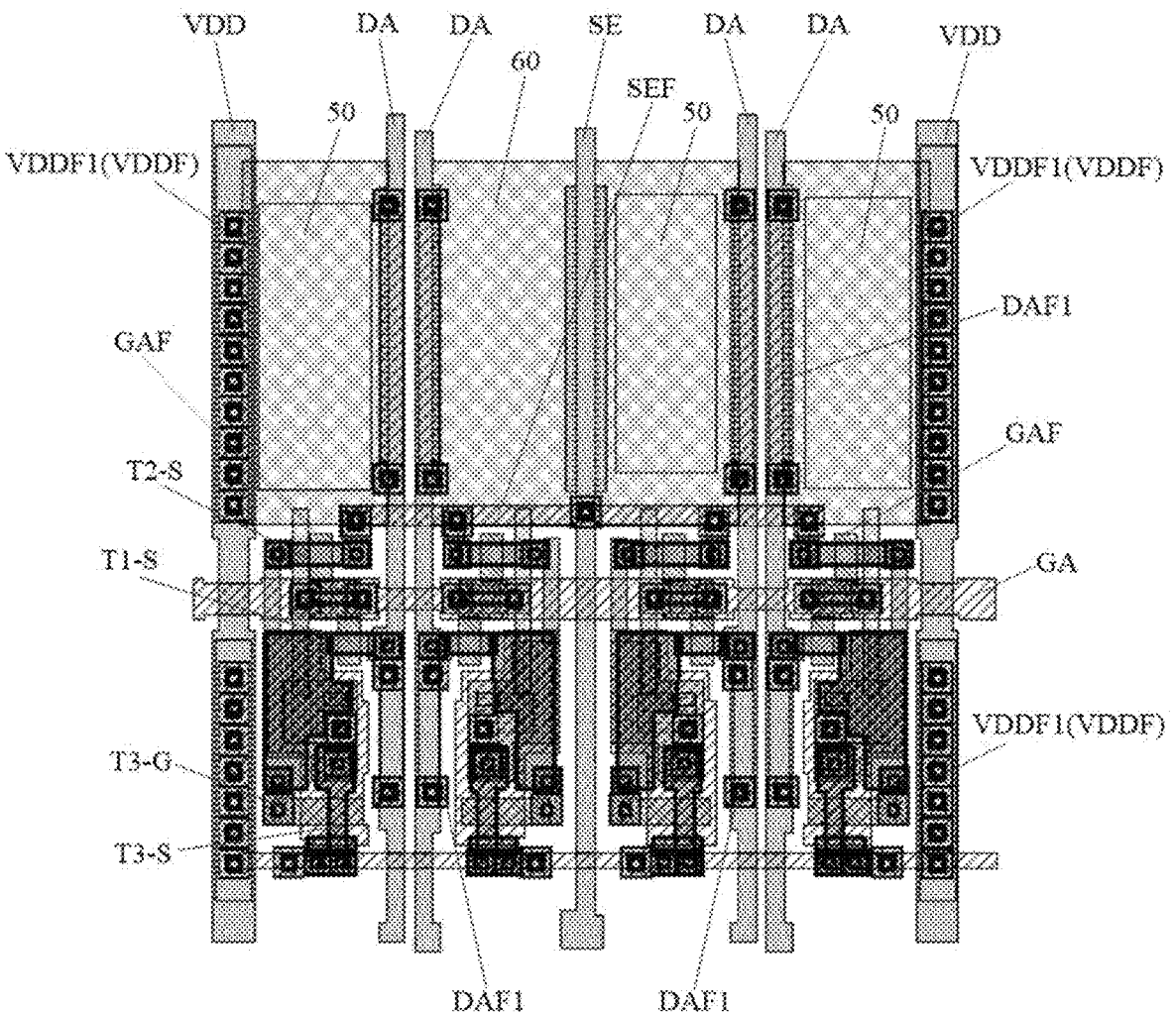
FIG. 18 is a schematic view showing the addition of the anode layer in FIG. 17.

It should be appreciated that, FIG. 6 and FIG. 14 show via holes formed by a CNT process, and FIG. 7 and FIG. 15 show via holes formed in the interlayer insulation layer through a mask process.

Subsequent to forming the interlayer insulation layer, the CNT process is performed to form half via holes not penetrating through the interlayer insulation layer, and then the mask process is performed on the interlayer insulation layer to form the via holes penetrating through the interlayer insulation layer. Subsequent to performing the mask process, a part of the via holes penetrate through the interlayer insulation layer and extend to the light shielding layer, and the other part of the via holes merely penetrate through the interlayer insulation layer.

For example, at least a part of the light shielding layer 10 is arranged between the active layer of the sub-pixel driving circuitry and the base substrate.

For example, an orthogonal projection of the light shielding layer 10 onto the base substrate at least partially overlaps orthogonal projections of active layers in a part of transistors in the sub-pixel driving circuitry onto the base substrate.

For example, the light shielding layer 10 is made of a conductive metal material, such as copper.

For example, the display substrate includes the plurality of scanning lines GA corresponding to the rows of pixel units respectively, and each scanning line GA is coupled to the sub-pixel driving circuitry in each sub-pixel in the corresponding row of pixel units.

For example, the scanning line GA is used to transmit the scanning signal. The scanning line GA is coupled to a gate electrode of a corresponding transistor in the sub-pixel driving circuitry to transmit the scanning signal to the gate electrode of the corresponding transistor.

For example, the scanning line GA extends in the first direction, i.e., the scanning line GA includes a main portion and a secondary portion coupled to the main portion, the main portion is of a linear, a segment-like, or a strip-like shape and extends in the first direction, and a length of the main portion extending in the first direction is greater than a length of the secondary portion extending in other directions.

According to the display substrate in the embodiments of the present disclosure, the scanning line GA is arranged at a same layer as the light shielding layer 10 so that the scanning line GA is arranged close to the base substrate. A resistance of the scanning line GA is reduced through increasing a thickness of the scanning line GA, and thereby a load of the scanning line GA is effectively reduced. As a result, it is able to prevent the occurrence of an excessive signal delay when the scanning signal is transmitted through the scanning line GA is transmitted through the scanning line GA, thereby to provide a high refresh rate, optimize a display effect, ensure operation stability, and prolong a service life of the display substrate.

In addition, the scanning line GA is close to the base substrate, so as to provide a large distance between the scanning line GA and other conductive structures in the display substrate in a direction perpendicular to the base substrate, thereby to reduce a parasitic capacitance between the scanning line GA and other conductive structures. In this regard, in the embodiments of the present disclosure, it is unnecessary to provide a thick insulation layer to the display substrate to reduce the parasitic capacitance, so it is able to effectively reduce the difficulty in the manufacture process of the display substrate, and improve the mass production feasibility of the display substrate.

In addition, the thick scanning line GA is close to the base substrate, so the scanning line GA is preferentially formed during the manufacture of the display substrate. In this way, it is able to prevent the base substrate from being deformed and effectively prevent the display substrate from being damaged.

In some embodiments of the present disclosure, a thickness d of the scanning line in a direction perpendicular to the base substrate is greater than or equal to 0.5 $\mu$m and less than or equal to 1.5 $\mu$m.

For example, the thickness d of the scanning line in the direction perpendicular to the base substrate is 1 $\mu$m.

Through setting the thickness of the scanning line GA as mentioned hereinabove, it is able to effectively reduce the load of the scanning line GA, prevent the excessive signal delay when the scanning signal is transmitted through the scanning line GA is transmitted through the scanning line GA, provide the high refresh rate, optimize the display effect, improve the operation stability, and prolong the service life of the display substrate.

As shown in FIG. 3, in some embodiments of the present disclosure, the scanning line GA is arranged at a same layer and made of a same material as the light shielding layer 10.

When the scanning line GA is arranged at a same layer and made of a same material as the light shielding layer 10, it is able to form the scanning line GA and the light shielding layer 10 through a single patterning process at the same time, thereby to effectively simplify the manufacture process of the display substrate and reduce the manufacture cost of the display substrate.

Figure 5:
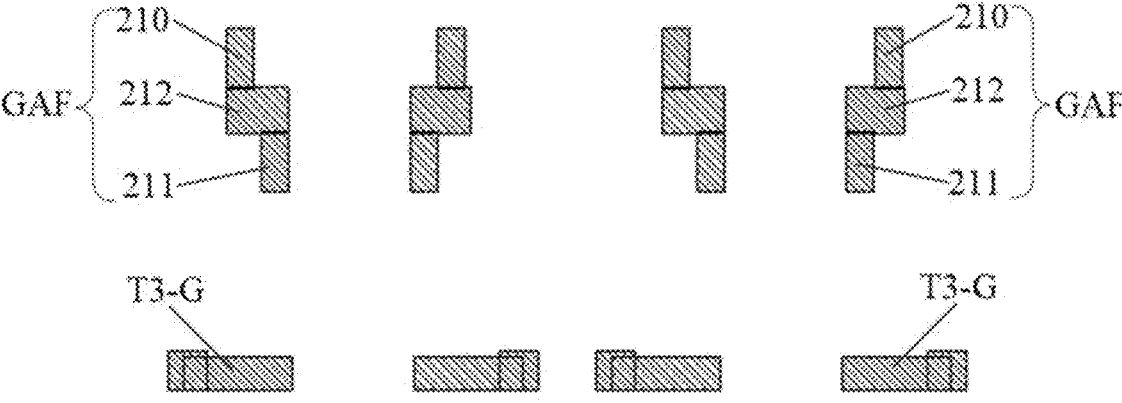
FIG. 5 is a schematic view showing a gate metal layer in FIG. 2.
Figure 13:
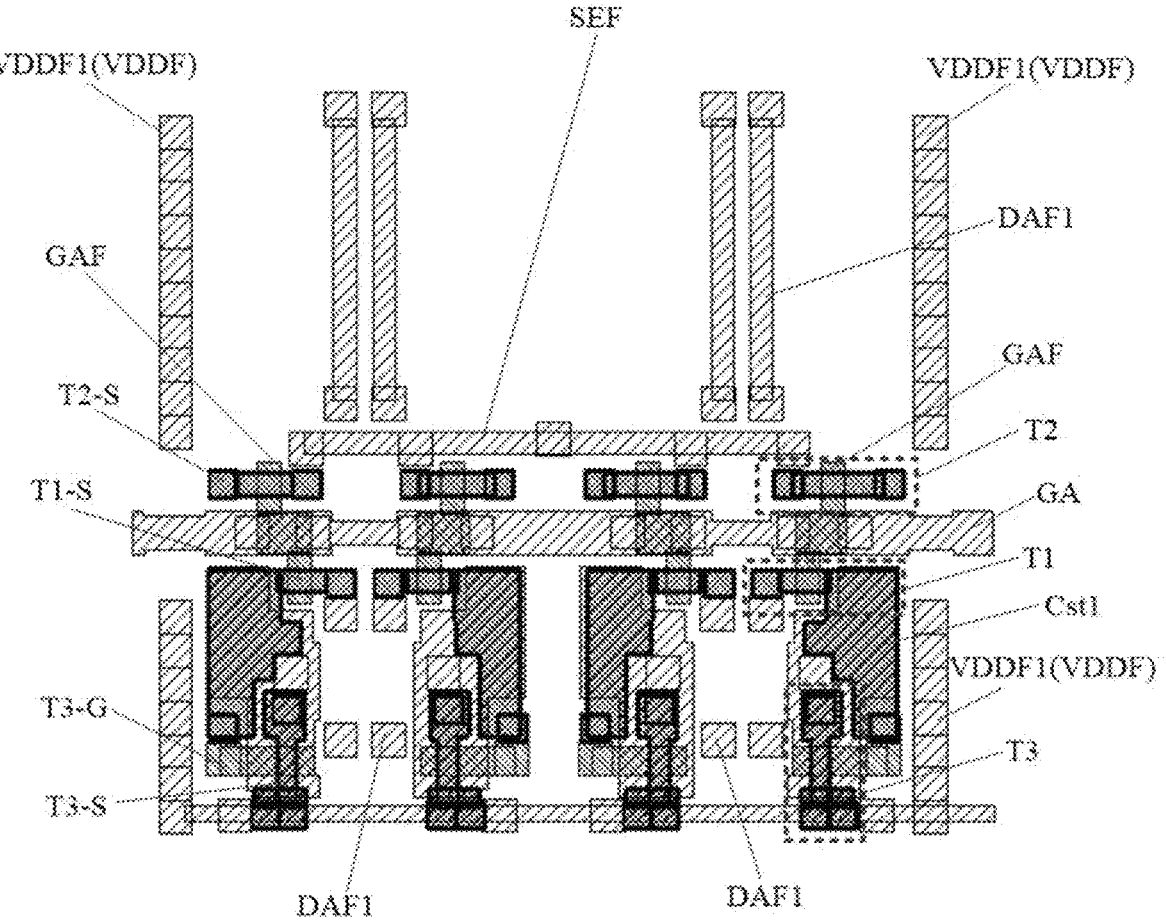
FIG. 13 is a schematic view showing the addition of the gate metal layer in FIG. 12.

As shown in FIG. 3, FIG. 5 and FIG. 13, in some embodiments of the present disclosure, the display substrate further includes an auxiliary scanning line GAF arranged at a side of a corresponding scanning line GA away from the base substrate and coupled to the corresponding scanning line GA and a sub-pixel driving circuitry in a corresponding sub-pixel.

For example, the display substrate includes a plurality of auxiliary scanning lines GAF corresponding to the sub-pixels in the display substrate respectively.

For example, the plurality of auxiliary scanning lines GAF in a same row in the first direction is coupled to a scanning line GA. For example, the plurality of auxiliary scanning lines GAF in a same row in the first direction is spaced apart from each other. For example, the plurality of auxiliary scanning lines GAF in a same row in the first direction is formed integrally.

For example, the auxiliary scanning line GAF is formed through the gate metal layer.

For example, the auxiliary scanning line GAF is formed integrally with the gate electrode of the corresponding transistor in the sub-pixel driving circuitry.

For example, there is an overlapping region between an orthogonal projection of the auxiliary scanning line GAF onto the base substrate and an orthogonal projection of the scanning line GA onto the base substrate.

Figure 8:
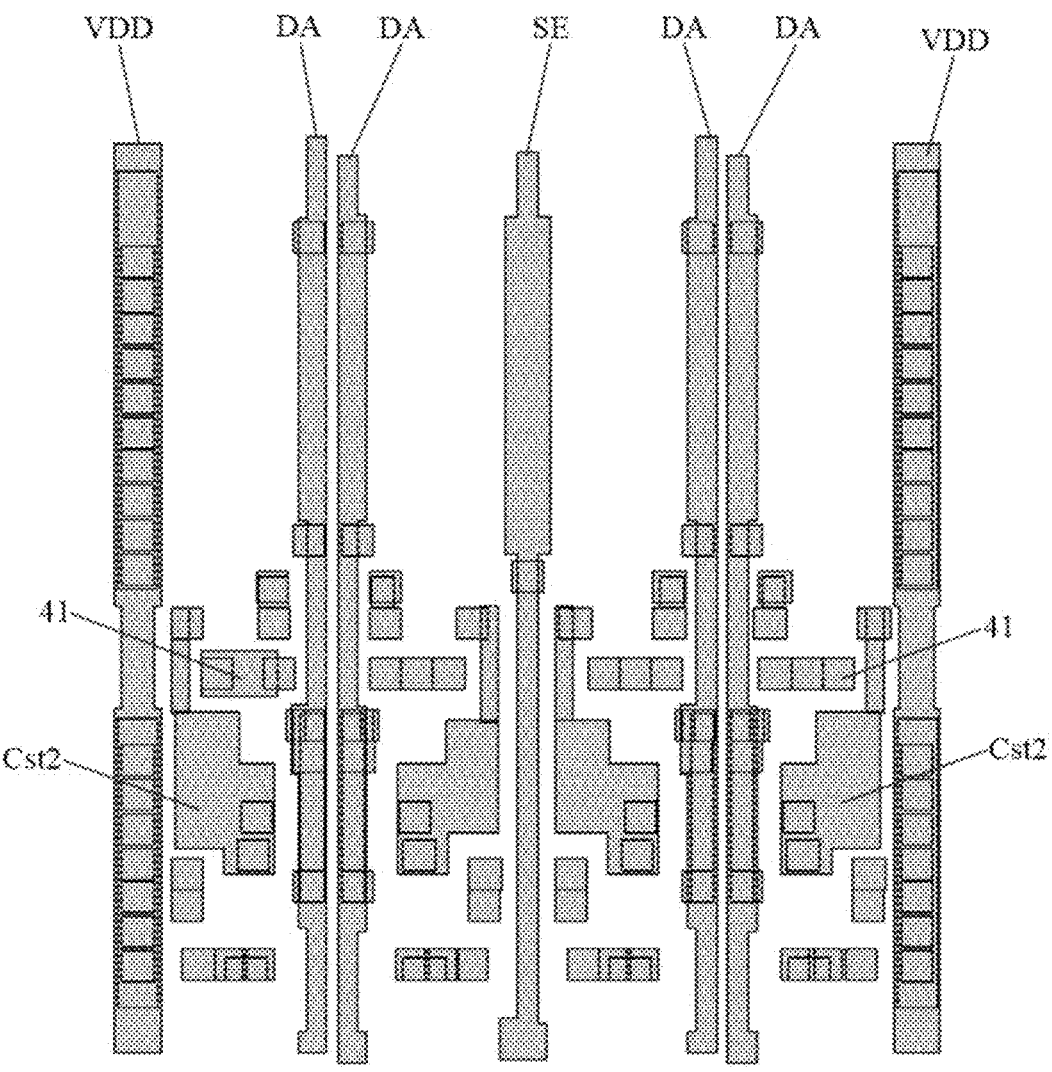
FIG. 8 is a schematic view showing a source/drain metal layer in FIG. 2.
Figure 9:
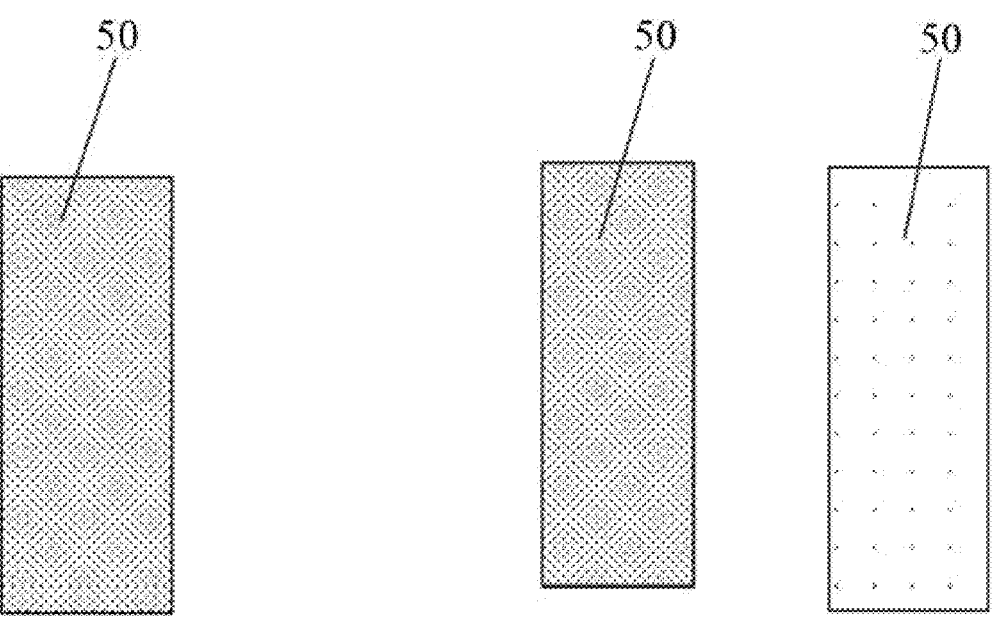
FIG. 9 is a schematic view showing a color filter pattern in FIG. 2.
Figure 10:
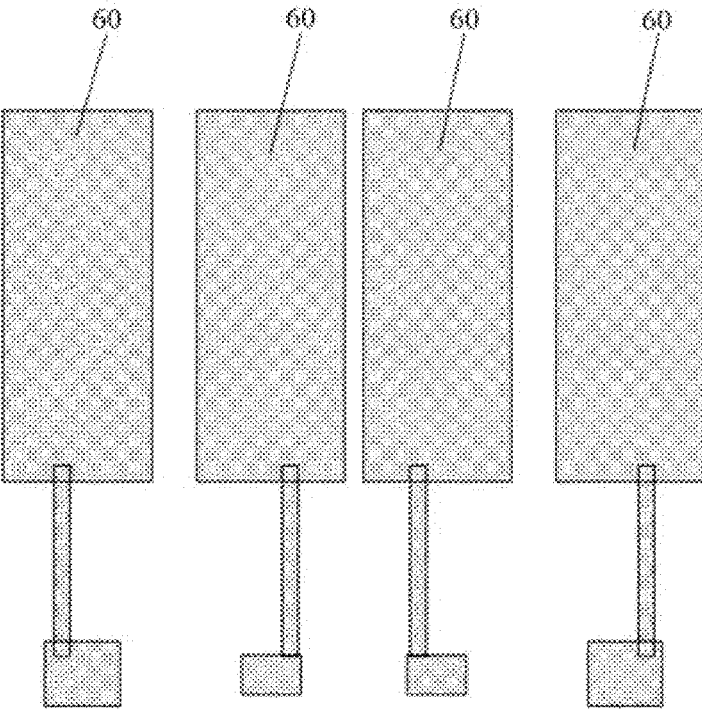
FIG. 10 is a schematic view showing an anode layer in FIG. 2.
Figure 11:
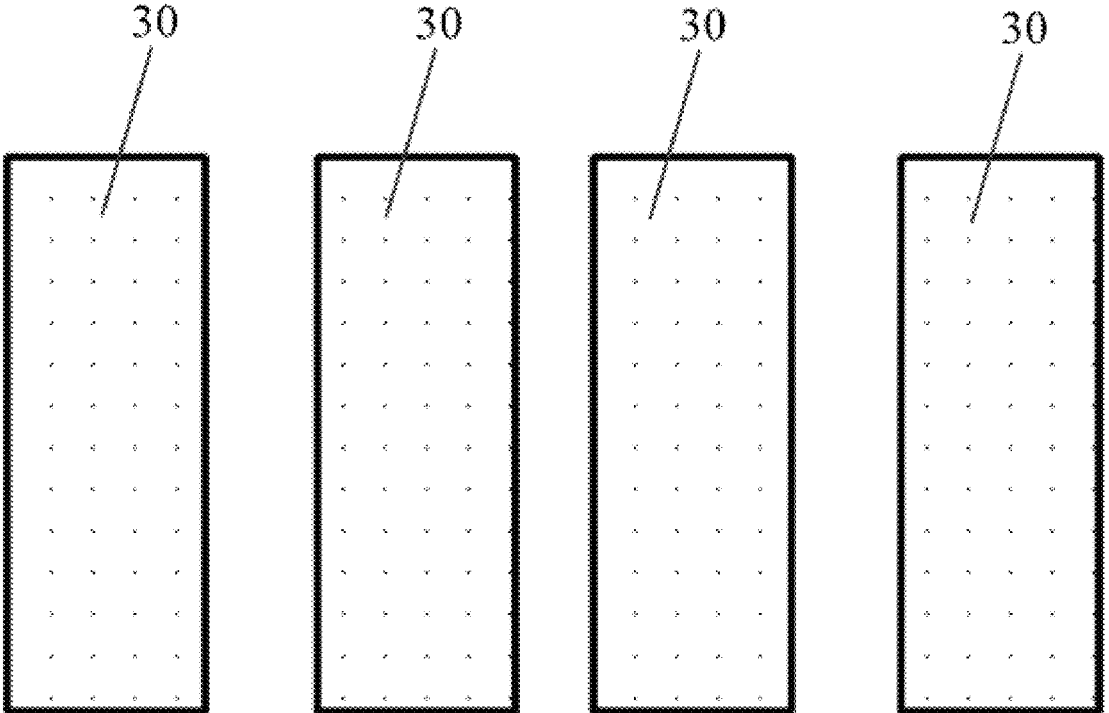
FIG. 11 is a schematic view showing a pixel aperture region in FIG. 2.
Figure 12:
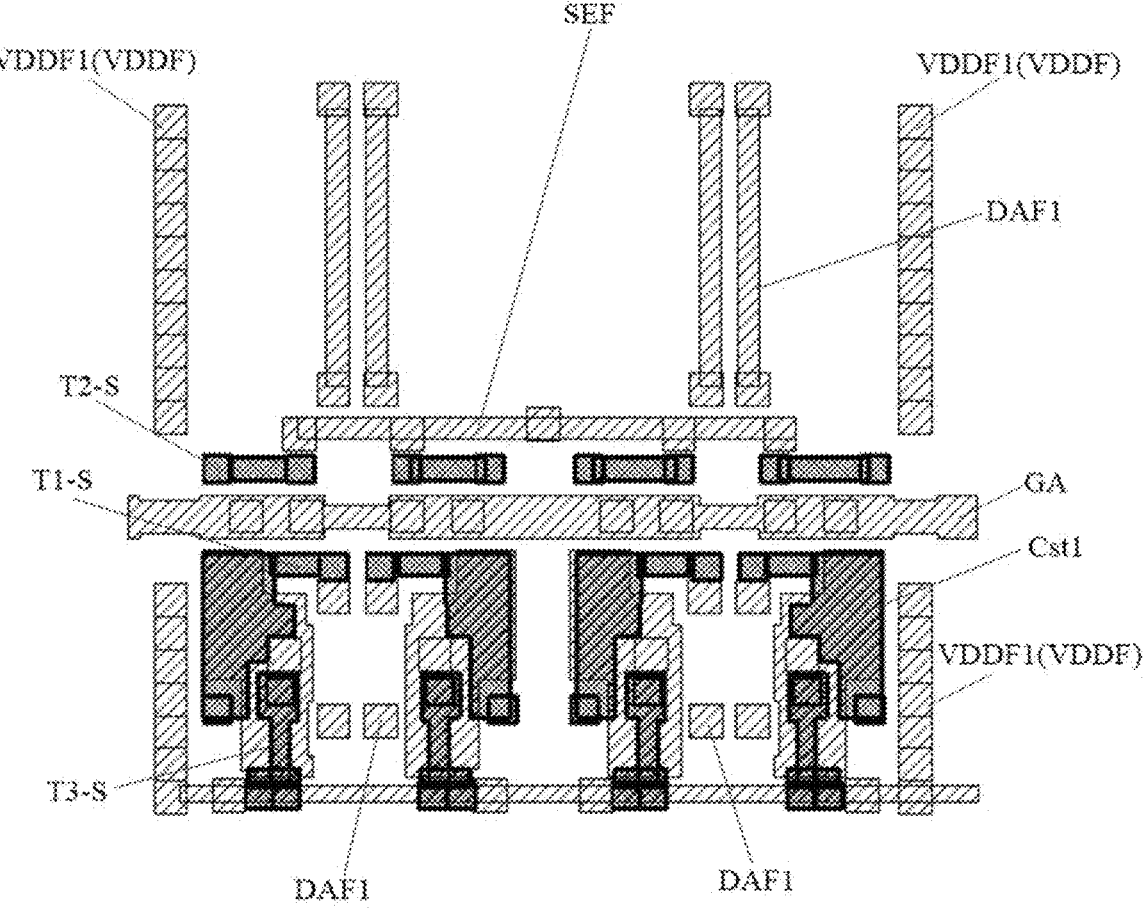
FIG. 12 is a schematic view showing the light shielding layer and the active layer in FIG. 2.

As shown in FIG. 8, for example, the pixel unit further includes a plurality of first conductive connection portions 41, each first conductive connection portion 41 includes at least a part extending in the first direction, and the first conductive connection portion 41 is coupled to the scanning line GA and a corresponding auxiliary scanning line GAF. For example, the first conductive connection portion 41 is arranged at a side of the auxiliary scanning line GAF away from the base substrate. For example, the first conductive connection portion 41 is arranged at a same layer and made of a same material as a data line DA.

When the pixel unit further includes the auxiliary scanning line GAF coupled to the scanning line GA, it is able to not only ensure the connection performance between the scanning line GA and the corresponding sub-pixel driving circuitry, but also to reduce the resistance of the scanning line GA, thereby to prevent the occurrence of the excessive signal delay in a better manner when the scanning signal is transmitted through the scanning line GA is transmitted through the scanning line GA, provide the high refresh rate, optimize the display effect, improve the operation stability, and prolong the service life of the display substrate.

As shown in FIG. 2, FIG. 5 and FIG. 13, in some embodiments of the present disclosure, the auxiliary scanning line GAF includes a first auxiliary scanning pattern 210, a second auxiliary scanning pattern 211 and a third auxiliary scanning pattern 212, the third auxiliary scanning pattern 212 is arranged between the first auxiliary scanning pattern 210 and the second auxiliary scanning pattern 211, the first auxiliary scanning pattern 210 and the second auxiliary scanning pattern 211 are coupled to the sub-pixel driving circuitry in the corresponding sub-pixel, and the third auxiliary scanning pattern 212 is coupled to the corresponding scanning line GA, the first auxiliary scanning pattern 210 and the second auxiliary scanning pattern 211. The corresponding scanning line GA coupled to the third auxiliary scanning pattern 212 includes a first boundary and a second boundary arranged in a second direction, the second direction crosses the first direction, an orthogonal projection of the first boundary onto the base substrate partially overlaps an orthogonal projection of the first auxiliary scanning pattern 210 onto the base substrate, and an orthogonal projection of the second boundary onto the base substrate partially overlaps an orthogonal projection of the second auxiliary scanning pattern 211 onto the base substrate.

For example, the first auxiliary scanning pattern 210, the second auxiliary scanning pattern 211 and the third auxiliary scanning pattern 212 are formed integrally.

For example, the first auxiliary scanning pattern 210 serves as a gate electrode of a sensing transistor T2, and the second auxiliary scanning pattern 211 serves as a gate electrode of a writing transistor T1.

For example, the first auxiliary scanning pattern 210 includes at least a part extending in the second direction, the second auxiliary scanning pattern 211 includes at least a part extending in the second direction, and the third auxiliary scanning pattern 212 includes at least a part extending in the first direction.

For example, an orthogonal projection of the third auxiliary scanning pattern 212 onto the base substrate is arranged within the orthogonal projection of the scanning line GA onto the base substrate.

For example, the first conductive connection portion 41 is coupled to the scanning line GA and the corresponding third auxiliary scanning pattern 212.

For example, the orthogonal projection of the first boundary onto the base substrate partially overlaps the orthogonal projection of the first auxiliary scanning pattern 210 onto the base substrate, and the orthogonal projection of the second boundary onto the base substrate partially overlaps the orthogonal projection of the second auxiliary scanning pattern 211 onto the base substrate.

For example, the orthogonal projection of the first boundary onto the base substrate partially overlaps the orthogonal projection of the third auxiliary scanning pattern 212 onto the base substrate, and the orthogonal projection of the second boundary onto the base substrate partially overlaps the orthogonal projection of the third auxiliary scanning pattern 212 onto the base substrate.

When the auxiliary scanning line GAF includes the first auxiliary scanning pattern 210, the second auxiliary scanning pattern 211 and the third auxiliary scanning pattern 212, it is able to not only ensure the connection performance between the scanning line GA and the corresponding sub-pixel driving circuitry, but also effectively reduce the difficulty in the layout of the display substrate.

As shown in FIG. 1, FIG. 2, FIG. 3, FIG. 8 and FIG. 16, in some embodiments of the present disclosure, the display substrate further includes: a data line DA including at least a part extending in a second direction, the second direction crossing the first direction, and the data line DA being coupled to the corresponding sub-pixel driving circuitry; and an auxiliary data line DAF coupled to a corresponding data line, arranged between the corresponding data line DA and the base substrate, and arranged at a same layer as the light shielding layer 10.

For example, the data line DA is used to transmit a data signal. The data line DA is coupled to a corresponding transistor in the sub-pixel driving circuitry to transmit the data signal to the corresponding transistor.

For example, the display substrate further includes a plurality of data lines DA. The plurality of sub-pixels is arranged in column corresponding to the data lines DA respectively. The data line DA is coupled to each sub-pixel driving circuitry in the corresponding column of sub-pixels.

For example, the display substrate includes the plurality of auxiliary data lines DAF, each data line DA corresponds to a plurality of auxiliary data lines DAF, and the data line DA is coupled to the corresponding auxiliary data lines. For example, the plurality of auxiliary data lines corresponding to each data line DA is spaced apart from each other in the second direction.

For example, the data line DA is formed through the source/drain metal layer.

For example, an orthogonal projection of the auxiliary data line DAF onto the base substrate at least partially overlaps an orthogonal projection of the corresponding data line DA onto the base substrate, and the auxiliary data line DAF is coupled to the corresponding data line DA through a via hole at an overlapping region.

For example, the orthogonal projection of the auxiliary data line DAF onto the base substrate is arranged within the orthogonal projection of the corresponding data line DA onto the base substrate.

For example, the auxiliary data line DAF includes at least a part extending in the second direction.

When each data line DA is coupled to the plurality of auxiliary data lines DAF, it is able to effectively reduce a resistance of the data line DA as well as a load of the data line DA, and prevent the occurrence of a signal delay when the data signal is transmitted through the data line DA, thereby to ensure the high refresh rate as well as the operation stability of the display substrate.

In addition, the light shielding layer 10 is thick in the direction perpendicular to the base substrate, so when the auxiliary data line DAF is arranged at a same layer and made of a same material as the light shielding layer 10, it is able to reduce the resistance of the data line DA in a better manner.

In addition, when the auxiliary data line DAF is arranged at a same layer and made of a same material as the light shielding layer 10, it is able to form the auxiliary data line DAF and the light shielding layer 10 through a single patterning process at the same time, thereby to effectively simplify the manufacture process of the display substrate and reduce the manufacture cost of the display substrate.

As shown in FIG. 1, FIG. 2, FIG. 3, FIG. 8 and FIG. 16, in some embodiments of the present disclosure, the scanning line GA includes a first scanning portion 201 and a second scanning portion 202, the first scanning portion 201 and the second scanning portion 202 extend in the first direction, a width d1 of the first scanning portion 201 is less than a width d2 of the second scanning portion 202 in a direction perpendicular to the first direction, and an orthogonal projection of the first scanning portion 201 onto the base substrate at least partially overlaps an orthogonal projection of the data line DA onto the base substrate.

For example, the first scanning portion 201 and the second scanning portion 202 are formed integrally.

For example, in a same scanning line GA, the first scanning portions 201 and the second scanning portions 202 are alternately arranged in the first direction.

For example, in a direction parallel to the base substrate and in the direction perpendicular to the first direction, the width of the first scanning portion 201 is less than the width of the second scanning portion 202.

For example, the orthogonal projection of the first scanning portion 201 onto the base substrate at least partially overlaps the orthogonal projection of the data line DA onto the base substrate; and an orthogonal projection of the second scanning portion 202 onto the base substrate at least partially overlaps the orthogonal projection of the data line DA onto the base substrate.

For example, the orthogonal projection of the first scanning portion 201 onto the base substrate at least partially overlaps the orthogonal projection of the data line DA onto the base substrate; and the orthogonal projection of the second scanning portion 202 onto the base substrate does not overlap the orthogonal projection of the data line DA onto the base substrate.

For example, the orthogonal projection of the first scanning portion 201 onto the base substrate at least partially overlaps an orthogonal projection of a power source line VDD onto the base substrate.

When the width of the first scanning portion 201 is less than the width of the second scanning portion 202 and the orthogonal projection of the first scanning portion 201 onto the base substrate at least partially overlaps the orthogonal projection of the data line DA onto the base substrate, it is able to reduce an overlapping area between the scanning line GA and the data line DA, thereby to reduce a parasitic capacitance formed between the scanning line GA and the data line DA.

As shown in FIG. 3, in some embodiments of the present disclosure, the auxiliary data line DAF includes at least two auxiliary data patterns DAF1 arranged in the second direction and coupled to a corresponding data line DA.

For example, the at least two auxiliary data patterns DAF1 are spaced apart from each other in the second direction.

For example, the auxiliary data pattern DAF1 includes at least a part extending in the second direction.

For example, an orthogonal projection of the auxiliary data pattern DAF1 onto the base substrate at least partially overlaps the orthogonal projection of the corresponding data line DA onto the base substrate.

For example, the orthogonal projection of the auxiliary data pattern DAF1 onto the base substrate is arranged within the orthogonal projection of the corresponding data line DA onto the base substrate.

When the auxiliary data line DAF includes at least two auxiliary data patterns DAF1, it is able to not only effectively reduce the resistance of the data line DA, but also reduce the risk of a short circuit between the auxiliary data line DAF and other conductive structures (e.g., the light shielding layer 10 and conductive structures arranged at the same layer as the light shielding layer 10), thereby to effectively reduce the difficulty in the layout of the auxiliary data patterns DAF1.

As shown in FIG. 1, FIG. 2, FIG. 3, FIG. 8 and FIG. 16, in some embodiments of the present disclosure, the orthogonal projection of the scanning line GA onto the base substrate is arranged between orthogonal projections of adjacent auxiliary data patterns DAF1 onto the base substrate.

When the orthogonal projection of the scanning line GA onto the base substrate is arranged between orthogonal projections of adjacent auxiliary data patterns DAF1 onto the base substrate, it is able to not only reduce the difficulty in the layout of the display substrate, but also improve the reliability and stability of the display substrate.

As shown in FIG. 2, FIG. 3, FIG. 8 and FIG. 16, in some embodiments of the present disclosure, the display substrate further includes: a power source line VDD including at least a part extending in the second direction and coupled to the corresponding sub-pixel driving circuitry; and an auxiliary power source line VDDF coupled to a corresponding power source line, arranged between the power source line and the base substrate, and arranged at a same layer and made of a same material as the light shielding layer 10.

For example, the power source line VDD is used to transmit a power signal (e.g., a positive power signal). The power source line VDD is coupled to a corresponding transistor in the sub-pixel driving circuitry to transmit the power signal to the corresponding transistor.

For example, the power source line VDD is formed through the source/drain metal layer.

For example, an orthogonal projection of the auxiliary power source line VDDF onto the base substrate at least partially overlaps an orthogonal projection of the corresponding power source line VDD onto the base substrate, and the auxiliary power source line VDDF is coupled to the corresponding power source line VDD through a via hole at an overlapping region.

For example, the orthogonal projection of the auxiliary power source line VDDF onto the base substrate is arranged within the orthogonal projection of the corresponding power source line VDD onto the base substrate.

For example, the auxiliary power source line VDDF includes at least a part extending in the second direction.

When the auxiliary power source line VDDF is coupled to the power source line VDD, it is able to effectively reduce a resistance of the power source line VDD, thereby to effectively reduce a load of the power source line VDD.

In addition, the light shielding layer 10 is thick in the direction perpendicular to the base substrate, so when the auxiliary power source line VDDF is arranged at a same layer and made of a same material as the light shielding layer 10, it is able to reduce the resistance of the power source line VDD in a better manner.

In addition, when the auxiliary power source line VDDF is arranged at a same layer and made of a same material as the light shielding layer 10, it is able to form the auxiliary power source line VDDF and the light shielding layer 10 through a single patterning process at the same time, thereby to effectively simplify the manufacture process of the display substrate and reduce the manufacture cost of the display substrate.

As shown in FIG. 2, FIG. 3, FIG. 8 and FIG. 16, in some embodiments of the present disclosure, the auxiliary power source line VDDF includes at least two auxiliary power source patterns VDDF1 arranged in the second direction and coupled to the corresponding power source line VDD.

For example, the at least two auxiliary power source patterns VDDF1 are spaced apart from each other in the second direction.

For example, each auxiliary power source pattern VDDF1 includes at least a part extending in the second direction.

For example, an orthogonal projection of the auxiliary power source patterns VDDF1 onto the base substrate at least partially overlaps the orthogonal projection of the corresponding power source line VDD onto the base substrate.

For example, the orthogonal projection of the auxiliary power source patterns VDDF1 onto the base substrate is arranged within the orthogonal projection of the corresponding power source line VDD onto the base substrate.

When the auxiliary power source line VDDF includes at least two auxiliary power source patterns VDDF1, it is able to not only effectively reduce the resistance of the power source line VDD, but also reduce the risk of a short circuit between the auxiliary power source line VDDF and other conductive structures (e.g., the light shielding layer 10 and conductive structures arranged at the same layer as the light shielding layer 10), thereby to effectively reduce the difficulty in the layout of the auxiliary power source patterns VDDF1.

As shown in FIG. 2, FIG. 3, FIG. 8 and FIG. 16, in some embodiments of the present disclosure, an orthogonal projection of at least one of the scanning lines GA onto the base substrate is arranged between orthogonal projections of adjacent auxiliary power source patterns VDDF1 onto the base substrate.

When the orthogonal projection of the scanning line GA onto the base substrate is arranged between orthogonal projections of adjacent auxiliary power source patterns VDDF1 onto the base substrate, it is able to not only reduce the difficulty in the layout of the display substrate, but also improve the reliability and stability of the display substrate.

As shown in FIG. 2, FIG. 3, FIG. 8 and FIG. 16, in some embodiments of the present disclosure, the display substrate further includes: a sensing line SE including at least a part extending in the second direction; and an auxiliary sensing line SEF coupled to the sensing line SE, arranged between the sensing line SE and the base substrate, and arranged at a same layer and made of a same material as the light shielding layer 10. The auxiliary sensing line SEF includes at least a part extending in the first direction, and is coupled to the corresponding sub-pixel driving circuitry.

For example, the display substrate includes a plurality of sensing lines SE, the plurality of pixel units in the display substrate is arranged in columns, one sensing line SE corresponds to the pixel units in one column, and the sensing line SE is coupled to each sub-pixel driving circuitry in the corresponding column of pixel units.

For example, the sensing line SE is formed through the source/drain metal layer.

For example, the sensing line SE provides a reference signal to reset the anode layer 60 of the light-emitting element EL within a data signal writing time period. The sensing line SE is further is used to transmit a sensing signal sensed from the anode layer 60 within a sensing time period.

For example, the auxiliary sensing line SEF includes at least a part extending in the first direction.

For example, the display substrate includes a plurality of auxiliary sensing lines SEF, one auxiliary sensing line SEF corresponds to one pixel unit in the display substrate, and the auxiliary sensing line SEF is coupled to each sub-pixel driving circuitry in the corresponding pixel unit and a corresponding sensing line SE.

For example, an orthogonal projection of the auxiliary sensing line SEF onto the base substrate at least partially overlaps an orthogonal projection of the corresponding sensing line SE onto the base substrate, and the auxiliary sensing line SEF is coupled to the sensing line SE at an overlapping region.

For example, the auxiliary sensing line SEF is coupled to a corresponding transistor in each sub-pixel driving circuitry in the corresponding pixel unit.

When the auxiliary sensing line SEF is coupled to the sensing line SE, it is able to effectively reduce a resistance of the sensing line SE, thereby to effectively reduce a load of the sensing line SE.

In addition, the light shielding layer 10 is thick in the direction perpendicular to the base substrate, so when the auxiliary sensing line SEF is arranged at a same layer and made of a same material as the light shielding layer 10, it is able to reduce the resistance of the sensing line SE in a better manner.

In addition, when the auxiliary sensing line SEF is arranged at a same layer and made of a same material as the light shielding layer 10, it is able to form the auxiliary sensing line SEF and the light shielding layer 10 through a single patterning process at the same time, thereby to effectively simplify the manufacture process of the display substrate and reduce the manufacture cost of the display substrate.

According to the display substrate in the embodiments of the present disclosure, it is able to effectively reduce the resistances of the scanning line GA, the data line DA, the sensing line SE and the power source line VDD without adding any new manufacture process, thereby to improve the signal delay when the signal is transmitted through the corresponding signal line. In addition, it is also able to reduce an IR drop of the power source line VDD during the transmission of a power source signal.

As shown in FIG. 1, FIG. 2 and FIG. 13, in some embodiments of the present disclosure, the sub-pixel driving circuitry includes: a driving transistor T3, a first electrode of the driving transistor T3 being coupled to the power source line VDD, and a second electrode of the driving transistor T3 being coupled to the light-emitting element EL; a writing transistor T1, a gate electrode of the writing transistor T1 being coupled to the scanning line GA, a first electrode of the writing transistor T1 being coupled to the data line DA, and a second electrode of the writing transistor T1 being coupled to a gate electrode T3-G of the driving transistor T3; a sensing transistor T2, a gate electrode of the sensing transistor T2 being coupled to the scanning line GA, a first electrode of the sensing transistor T2 being coupled to the second electrode of the driving transistor T3, and a second electrode of the sensing transistor T2 being coupled to the sensing line SE; and a storage capacitor Cst, a first electrode plate Cst1 of the storage capacitor Cst being coupled to the gate electrode T3-G of the driving transistor T3, and a second electrode plate Cst2 of the storage capacitor Cst being coupled to the second electrode of the driving transistor T3.

Figure 4:
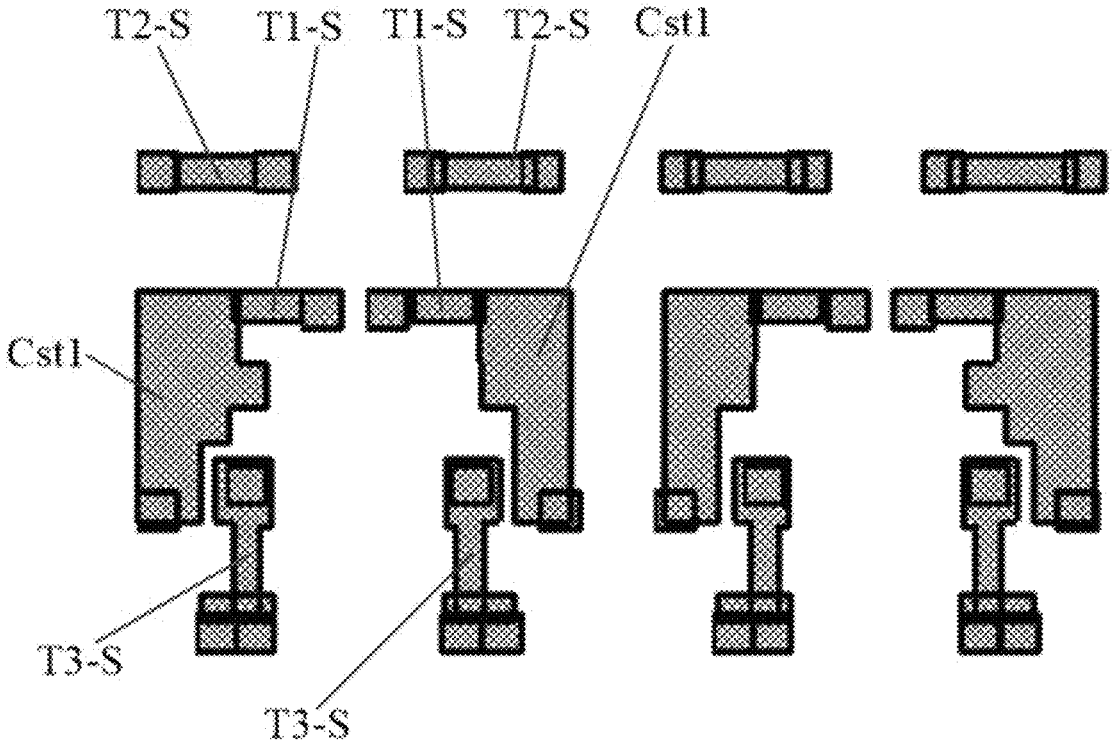
FIG. 4 is a schematic view showing an active layer in FIG. 2.

It should be appreciated that, as shown in FIG. 4, in each pixel unit, areas of the first electrode plates Cst1 of the storage capacitors Cst in at least two sub-pixels may be different from each other, so as to meet the requirements of different sub-pixels on capacitances of the storage capacitors.

For example, the first electrode of the driving transistor T3 is coupled to the power source line VDD, and the second electrode of the driving transistor T3 is coupled to the anode layer 60 of the light-emitting element EL.

For example, the writing transistor T1 and the sensing transistor T2 are both switching transistors.

For example, the writing transistor T1 is turned on or turned off under the control of the scanning signal provided by the scanning line GA, and the sensing transistor T2 is turned on or turned off under the control of the scanning signal provided by the scanning line GA.

For example, the sub-pixel driving circuitry includes a 3T1C structure, and each pixel unit includes one scanning line GA.

For example, an orthogonal projection of the first electrode plate Cst1 of the storage capacitor Cst onto the base substrate at least partially overlaps an orthogonal projection of the second electrode plate Cst2 of the storage capacitor Cst onto the base substrate.

Through reducing the load of the scanning line GA, it is able to prevent the signal delay when the scanning signal is transmitted through the scanning line GA is transmitted through the scanning line GA, and ensure a charging rate of the data line DA for writing the data signal into the gate electrode T3-G of the driving transistor T3, thereby to meet the requirement of the display substrate on the high refresh rate and ensure the transmission of the sensing signal and the reference signal.

As shown in FIG. 2 to FIG. 4, in some embodiments of the present disclosure, the writing transistor T1 includes a writing active layer T1-S, and the sensing transistor T2 includes a sensing active layer T2-S. In a same pixel unit, an orthogonal projection of the writing active layer T1-S onto the base substrate is arranged at a first side of an orthogonal projection of the scanning line GA coupled to the writing transistor T1 onto the base substrate, an orthogonal projection of the sensing active layer T2-S onto the base substrate is arranged at a second side of the orthogonal projection of the scanning line GA onto the base substrate, and the first side and the second side are opposite to each other in the second direction.

For example, in the same pixel unit, at least a part of the orthogonal projection of the scanning line GA onto the base substrate is arranged between the orthogonal projection of the writing active layer T1-S onto the base substrate and the orthogonal projection of the sensing active layer T2-S onto the base substrate.

For example, both the writing active layer T1-S and the sensing active layer T2-S are made of a transparent material. For example, both the writing active layer T1-S and the sensing active layer T2-S are made of a transparent metal oxide material.

For example, the writing active layer T1-S includes at least a part extending in the first direction.

For example, the writing active layer T1-S and the first electrode plate Cst1 of the storage capacitor Cst are formed integrally.

For example, the sensing active layer T2-S includes at least a part extending in the first direction.

For example, the orthogonal projection of the scanning line GA onto the base substrate does not overlap the orthogonal projection of the writing active layer T1-S onto the base substrate.

For example, the orthogonal projection of the scanning line GA onto the base substrate does not overlap the orthogonal projection of the sensing active layer T2-S onto the base substrate.

When the orthogonal projection of the scanning line GA onto the base substrate is arranged between the orthogonal projection of the writing active layer T1-S onto the base substrate and the orthogonal projection of the sensing active layer T2-S onto the base substrate, it is able to reduce the difficulty in the layout of the pixel units in a limited space and provide the display substrate with a high resolution.

As shown in FIG. 2 to FIG. 4, in some embodiments of the present disclosure, the driving transistor T3 includes the driving active layer T3-S, and at least a part of the orthogonal projection of the writing active layer T1-S onto the base substrate is arranged between an orthogonal projection of the driving active layer T3-S onto the base substrate and the orthogonal projection of the scanning line GA onto the base substrate.

For example, the driving active layer T3-S includes at least a part extending in the second direction.

For example, the driving active layer T3-S is made of a transparent material. For example, the driving active layer T3-S is made of a transparent metal oxide material.

For example, the gate electrode T3-G of the driving transistor T3 includes at least a part extending in the first direction.

Based on the above, it is able to reduce the difficulty in the layout of the pixel units in a limited space and provide the display substrate with a high resolution.

As shown in FIG. 2 to FIG. 11, in some embodiments of the present disclosure, the sub-pixel further includes a pixel definition layer for defining a pixel aperture, and in a same sub-pixel, the orthogonal projection of the sensing active layer T2-S onto the base substrate is arranged between an orthogonal projection of the pixel aperture onto the base substrate and the orthogonal projection of the scanning line GA onto the base substrate.

For example, a pixel aperture region 30 is formed at a position where the pixel aperture is located, and the pixel aperture region 30 includes at least a part extending in the second direction.

For example, the orthogonal projection of the pixel aperture onto the base substrate does not overlap an orthogonal projection of the sub-pixel driving circuitry onto the base substrate.

When the orthogonal projection of the sensing active layer T2-S onto the base substrate is arranged between the orthogonal projection of the pixel aperture onto the base substrate and the orthogonal projection of the scanning line GA onto the base substrate, the orthogonal projection of the pixel aperture onto the base substrate and the orthogonal projection of the sub-pixel driving circuitry onto the base substrate are arranged in the second direction, so it is able to provide a sufficient large space for the pixel opening, ensure a pixel aperture ratio of the display substrate, and reduce the difficulty in the layout of the pixel units.

As shown in FIG. 4, in some embodiments of the present disclosure, the first electrode plate Cst1 is arranged at a same layer and made of a same material as the driving active layer T3-S, the second electrode plate Cst2 is arranged at a same layer and made of a same material as the data line DA, the second electrode plate Cst2 is coupled to the light shielding layer 10, and an orthogonal projection of the second electrode plate Cst2 onto the base substrate at least partially overlaps an orthogonal projection of the light shielding layer 10 onto the base substrate.

When the first electrode plate Cst1 is arranged at a same layer and made of a same material as the driving active layer T3-S, it is able to form the first electrode plate Cst1 and the driving active layer T3-S through a single patterning process at the same time, thereby to effectively simplify the manufacture process of the display substrate and reduce the manufacture cost of the display substrate.

Identically, when the second electrode plate Cst2 is arranged at a same layer and made of a same material as the data line DA, it is able to form the second electrode plate Cst2 and the data line DA through a single patterning process at the same time, thereby to effectively simplify the manufacture process of the display substrate and reduce the manufacture cost of the display substrate.

Based on the above, it is able to improve the operation stability of the storage capacitor Cst.

As shown in FIG. 2 to FIG. 4, in some embodiments of the present disclosure, the driving active layer T3-S includes a driving channel portion, and the orthogonal projection of the light shielding layer 10 onto the base substrate at least partially overlaps an orthogonal projection of the driving channel portion onto the base substrate.

For example, the driving channel portion in the driving active layer T3-S id used to form a part of the first electrode of the driving transistor T3, and a part of the second electrode of the driving transistor T3. An orthogonal projection of the driving channel portion onto the base substrate is within an orthogonal projection of the gate electrode T3-G of the driving transistor T3 onto the base substrate.

When the orthogonal projection of the light shielding layer 10 onto the base substrate at least partially overlap an orthogonal projection of the driving channel portion onto the base substrate, it is able to effectively prevent the driving transistor 3 from being adversely affected by leakage light, thereby to ensure operation stability of the driving transistor T3.

The present disclosure further provides in some embodiments a display device including the above-mentioned display substrate.

For example, the display device includes an oversized, high resolution, and bottom-emission OLED display device. For example, the display device includes an active-matrix organic light-emitting diode display device.

It should be appreciated that, the display device may be any product or member having a display function, such as a television, a display, a digital photo frame, a mobile phone and a tablet computer. The display device further includes a flexible circuit board, a printed circuit board and a back plate.

According to the display substrate in the embodiments of the present disclosure, the scanning line GA is arranged at a same layer as the light shielding layer 10 so that the scanning line GA is arranged close to the base substrate. A resistance of the scanning line GA is reduced through increasing a thickness of the scanning line GA, and thereby a load of the scanning line GA is effectively reduced. As a result, it is able to prevent the occurrence of an excessive signal delay when the scanning signal is transmitted through the scanning line GA, thereby to provide a high refresh rate, optimize a display effect, ensure operation stability, and prolong a service life of the display substrate. In addition, the scanning line GA is close to the base substrate, so as to provide a large distance between the scanning line GA and other conductive structures in the display substrate in a direction perpendicular to the base substrate, thereby to reduce a parasitic capacitance between the scanning line GA and other conductive structures. In this regard, in the embodiments of the present disclosure, it is unnecessary to provide a thick insulation layer to the display substrate to reduce the parasitic capacitance, so it is able to effectively reduce the difficulty in the manufacture process of the display substrate, and improve the mass production feasibility of the display substrate.

In addition, the thick scanning line GA is close to the base substrate, so the scanning line GA is preferentially formed during the manufacture of the display substrate. In this way, it is able to prevent the base substrate from being deformed and effectively prevent the display substrate from being damaged.

In this regard, when the display device includes the above-mentioned display substrate, it is able to achieve the same beneficial effects, which will thus not be particularly defined herein.

It should be appreciated that, the expression "at a same layer" refers to that the film layers are arranged on a same structural layer. Alternatively, for example, the film layers on a same layer may be layer structures formed through forming thin layers for forming specific patterns through a single-film-forming process and then patterning the film layers with a same mask through a single patterning process. Depending on different specific patterns, a single patterning process may include multiple exposing, development or etching processes, and the specific patterns in the layer structure may be continuous or discontinuous. These specific patterns may also be arranged at different levels or have different thicknesses.

In the embodiments of the present disclosure, the order of the steps is not limited to the serial numbers thereof. For a person skilled in the art, any change in the order of the steps shall also fall within the scope of the present disclosure if without any creative effort.

It should be further appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a base substrate and a plurality of pixel units on the base substrate, wherein each pixel unit comprises: a plurality of sub-pixels arranged in sequence in a first direction, each sub-pixel comprising a sub-pixel driving circuitry and a light-emitting element coupled to each other, and the sub-pixel driving circuitry being configured to provide a driving signal to the light-emitting element; and a light shielding layer, at least a part of the light shielding layer being arranged between the sub-pixel driving circuitry and the base substrate, wherein the display substrate further comprises a plurality of scanning lines, each scanning line comprises at least a part extending in the first direction and is coupled to a corresponding sub-pixel driving circuitry, and the scanning line is arranged at a same layer as the light shielding layer;

wherein a thickness d of the scanning line in a direction perpendicular to the base substrate is greater than or equal to 0.5 μm and less than or equal to 1.5 μm; or wherein the scanning line is arranged at the same layer and made of a same material as the light shielding layer;

wherein the display substrate further comprises a data line, the data line comprising at least a part extending in a second direction crossing the first direction and being coupled to the corresponding sub-pixel driving circuitry;

wherein the scanning line comprises a first scanning portion and a second scanning portion, the first scanning portion and the second scanning portion extend in the first direction, a width of the first scanning portion is less than a width of the second scanning portion in a direction perpendicular to the first direction, and an orthogonal projection of the first scanning portion onto the base substrate at least partially overlaps an orthogonal projection of the data line onto the base substrate.

2. The display substrate according to claim 1, further comprising an auxiliary scanning line arranged at a side of a corresponding scanning line away from the base substrate and coupled to the corresponding scanning line and a sub-pixel driving circuitry in a corresponding sub-pixel.

3. The display substrate according to claim 2, wherein the auxiliary scanning line comprises a first auxiliary scanning pattern, a second auxiliary scanning pattern and a third auxiliary scanning pattern, the third auxiliary scanning pattern is arranged between the first auxiliary scanning pattern and the second auxiliary scanning pattern, the first auxiliary scanning pattern and the second auxiliary scanning pattern are coupled to the sub-pixel driving circuitry in the corresponding sub-pixel, and the third auxiliary scanning pattern is coupled to the corresponding scanning line, the first auxiliary scanning pattern and the second auxiliary scanning pattern, wherein the scanning line coupled to the third auxiliary scanning pattern comprises a first boundary and a second boundary arranged in a second direction, the second direction crosses the first direction, an orthogonal projection of the first boundary onto the base substrate partially overlaps an orthogonal projection of the first auxiliary scanning pattern onto the base substrate, and an orthogonal projection of the second boundary onto the base substrate partially overlaps an orthogonal projection of the second auxiliary scanning pattern onto the base substrate.

4. The display substrate according to claim 2, further comprising: an auxiliary data line coupled to a corresponding data line, arranged between the corresponding data line and the base substrate, and arranged at a same layer and made of a same material as the light shielding layer.

5. The display substrate according to claim 4, wherein the auxiliary data line comprises at least two auxiliary data patterns arranged in the second direction, and coupled to a corresponding data line.

6. The display substrate according to claim 5, wherein an orthogonal projection of the scanning line onto the base substrate is arranged between orthogonal projections of adjacent auxiliary data patterns onto the base substrate.

7. The display substrate according to claim 4, further comprising: a power source line comprising at least a part extending in the second direction and coupled to the corresponding sub-pixel driving circuitry; and an auxiliary power source line coupled to a corresponding power source line, arranged between the power source line and the base substrate, and arranged at a same layer and made of a same material as the light shielding layer.

8. The display substrate according to claim 7, wherein the auxiliary power source line comprises at least two auxiliary power source patterns arranged in the second direction and coupled to the corresponding power source line.

9. The display substrate according to claim 8, wherein an orthogonal projection of at least one of the scanning lines onto the base substrate is arranged between orthogonal projections of adjacent auxiliary power source patterns onto the base substrate.

10. The display substrate according to claim 7, further comprising: a sensing line comprising at least a part extending in the second direction; and an auxiliary sensing line coupled to the sensing line, arranged between the sensing line and the base substrate, and arranged at a same layer and made of a same material as the light shielding layer, wherein the auxiliary sensing line comprises at least a part extending in the first direction, and is coupled to the corresponding sub-pixel driving circuitry.

11. The display substrate according to claim 10, wherein the sub-pixel driving circuitry comprises: a driving transistor, a first electrode of the driving transistor being coupled to the power source line, and a second electrode of the driving transistor being coupled to the light-emitting element; a writing transistor, a gate electrode of the writing transistor being coupled to the scanning line, a first electrode of the writing transistor being coupled to the data line, and a second electrode of the writing transistor being coupled to a gate electrode of the driving transistor; a sensing transistor, a gate electrode of the sensing transistor being coupled to the scanning line, a first electrode of the sensing transistor being coupled to the second electrode of the driving transistor, and a second electrode of the sensing transistor being coupled to the sensing line; and a storage capacitor, a first electrode plate of the storage capacitor being coupled to the gate electrode of the driving transistor, and a second electrode plate of the storage capacitor being coupled to the second electrode of the driving transistor.

12. The display substrate according to claim 11, wherein the writing transistor comprises a writing active layer, the sensing transistor comprises a sensing active layer, and in a same pixel unit, an orthogonal projection of the writing active layer onto the base substrate is arranged at a first side of an orthogonal projection of the scanning line coupled to the writing transistor onto the base substrate, an orthogonal projection of the sensing active layer onto the base substrate is arranged at a second side of the orthogonal projection of the scanning line onto the base substrate, and the first side and the second side are opposite to each other in the second direction.

13. The display substrate according to claim 12, wherein the driving transistor comprises a driving active layer, and at least a part of the orthogonal projection of the writing active layer onto the base substrate is arranged between an orthogonal projection of the driving active layer onto the base substrate and the orthogonal projection of the scanning line onto the base substrate.

14. The display substrate according to claim 13, wherein the sub-pixel further comprises a pixel definition layer for defining a pixel aperture, and in a same sub-pixel, the orthogonal projection of the sensing active layer onto the base substrate is arranged between an orthogonal projection of the pixel aperture onto the base substrate and the orthogonal projection of the scanning line onto the base substrate.

15. The display substrate according to claim 12, wherein the first electrode plate is arranged at a same layer and made of a same material as the driving active layer, the second electrode plate is arranged at a same layer and made of a same material as the data line, the second electrode plate is coupled to the light shielding layer, and an orthogonal projection of the second electrode plate onto the base substrate at least partially overlaps an orthogonal projection of the light shielding layer onto the base substrate.

16. The display substrate according to claim 12, wherein the driving active layer comprises a driving channel portion, and the orthogonal projection of the light shielding layer onto the base substrate at least partially overlaps an orthogonal projection of the driving channel portion onto the base substrate.

17. A display device comprising the display substrate according to claim 1.

* * * * *